United States Patent
Savukov et al.

(10) Patent No.: US 10,613,163 B1
(45) Date of Patent: Apr. 7, 2020

(54) MICRO-IMAGING WITH AN ATOMIC MAGNETOMETER AND FLUX GUIDE

(71) Applicant: Triad National Security, LLC, Los Alamos, NM (US)

(72) Inventors: Igor Savukov, Los Alamos, NM (US); Young Jin Kim, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 406 days.

(21) Appl. No.: 15/417,254

(22) Filed: Jan. 27, 2017

Related U.S. Application Data

(60) Provisional application No. 62/292,888, filed on Feb. 9, 2016.

(51) Int. Cl.
*G01R 33/26* (2006.01)

(52) U.S. Cl.
CPC .................................. *G01R 33/26* (2013.01)

(58) Field of Classification Search
CPC ...... G01R 33/26; G01R 33/24; G01R 33/032; G01R 33/282; G01R 33/0354; A61B 5/055
See application file for complete search history.

(56) References Cited

U.S. PATENT DOCUMENTS

| | | | | |
|---|---|---|---|---|
| 2006/0244444 | A1* | 11/2006 | Faley | G01R 33/0354 324/249 |
| 2010/0090697 | A1* | 4/2010 | Savukov | G01R 33/26 324/309 |

OTHER PUBLICATIONS

Teixeira, J. M., et al. "Versatile, high sensitivity, and automatized angular dependent vectorial Kerr magnetometer for the analysis of nanostructured materials." Review of Scientific Instruments 82.4 (2011): 043902. (Year: 2011).*

Kim, Young Jin, and Igor Savukov. "Ultra-sensitive magnetic microscopy with an optically pumped magnetometer." Scientific reports 6 (2016): 24773. (Year: 2016).*

Kim, Young Jin, et al. "Magnetic microscopic imaging with an optically pumped magnetometer and flux guides." Applied Physics Letters 110.4 (2017): 043702. (Year: 2017).*

* cited by examiner

*Primary Examiner* — Rishi R Patel
(74) *Attorney, Agent, or Firm* — LeonardPatel PC; Michael Aristo Leonard, II; Sheetal Suresh Patel

(57) ABSTRACT

Micro-imaging may be performed with an ultra-sensitive atomic magnetometer (AM) and an array of flux guides (FGs). The array of FGs may be configured to act as a magnetic lens that expands microscopic magnetic distribution to match dimensions of the AM. A plurality of single channel AMs may be combined into an array, or the AM may include an array of photodetectors, to realize multi-channel operation.

19 Claims, 24 Drawing Sheets

RELATED ART

1700

1710

MICRO-IMAGING WITH AN ATOMIC MAGNETOMETER AND FLUX GUIDE

CROSS REFERENCE TO RELATED APPLICATION

This application claims the benefit of U.S. Provisional Patent Application No. 62/292,888 filed Feb. 9, 2016. The subject matter of this earlier filed application is hereby incorporated by reference in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The present invention generally relates to micro-imaging, and more particularly, to micro-imaging with an atomic magnetometer (AM) and flux guides (FGs).

BACKGROUND

Improvements in resolution and sensitivity for magnetometer technologies are beneficial for a variety of fields. Currently, the most sensitive sensors are superconducting quantum interference devices (SQUIDs) and optically pumped magnetometers (OPMs), both with sensitivities below 1 fT/$\sqrt{Hz}$ when the sensor size is on the order of a centimeter. Specially configured SQUIDs and Hall probes have micrometer scale resolution.

However, as shown in graph 100 of FIG. 1, current magnetometer technologies, including Hall probes, SQUIDs, and vapor cells, all current magnetic field sensors involve a tradeoff between resolution and sensitivity. For instance, the micrometer scale resolution in specially configured SQUIDs and Hall probes is achieved with a sensitivity on the order of nT/$\sqrt{Hz}$. This lower sensitivity is a serious limitation for recording magnetic fields of one or a small number of neurons for magnetoencephalography (MEG), for instance, which is a diagnostic technique for studying the brain through measurements of its magnetic field. Single neurons have dimensions on the order of 10-100 μm and are thought to produce (current dipole) ~10 pT magnetic fields at 100 μm standoff (see simulated neuron image 200 of FIG. 2), which is out of reach of current technologies. Hence, MEG can today only measure averages over large numbers of neurons.

There are two competing technologies for studying brain electrical activity at high resolution: (1) microelectrodes inserted directly into exposed tissue; and (2) MEG with micro-SQUID magnetometers. While microelectrodes are the gold standard for recording electrical activities of neurons, they have several significant problems, including invasiveness, disturbance of neurons, sparseness in space, and the immune system reaction. While there have been initial attempts at imaging in small animal MEG using low-critical temperature (low-Tc) micro-SQUIDs, micro-SQUID performance is not sufficient for micro-MEG (see FIG. 1). Low-Tc is the critical temperature at which the material becomes superconductive, usually requiring liquid helium for cooling. It is also difficult to isolate the cryogenic SQUID from the body temperature biological object.

Nitrogen-vacancy (NV)-diamond magnetometers, which can detect a single electron spin, are promising, but they require irradiation by microwave power and that the target be placed in very close proximity to the NV centers, which may be difficult to achieve. Giant magnetoresistance and similar solid-state devices are also capable of high resolution, but the sensitivity is not sufficient for single neuron detection. A magnetic tunnel junction (MTJ) achieved sensitivity of 133 nT/$\sqrt{Hz}$ at 1 Hz, but this required flux concentrators of a size of about 1 mm, limiting the resolution to the same order. Due to the limitations of these techniques, magnetic field measurements of brain activity, i.e., conventional MEG, are performed with cm-scale sensors which measure the average field over 104 to 105 neurons. As a result, many important problems which require microscopic resolution remain unsolved. High-resolution, ultra-sensitive magnetometry, capable of detecting a single or a small number of neurons, would greatly aid in improving understanding of brain function and investigating the origins of the MEG signal at a small scale.

One way to improve resolution while maintaining high sensitivity is by miniaturizing OPMs operating in the spin-exchange relaxation-free (SERF) regime. Unfortunately, the sensitivity-resolution tradeoff is far from optimal. When the OPM cell dimension is below 1 mm, spin relaxation is dominated by the spin-destructive collisions on the cell walls and $T_2 \sim a^2$, where $T_2$ is the transverse relaxation time and a is the cell dimension. The sensitivity is then determined both by spin-fluctuation noise, which goes as $1/\sqrt{nVT_2} \sim a^{-5/2}$, and by photon-shot noise, which goes as $$\frac{1}{nlT_2} \sim a^{-3},$$

where n is the density, V is the active volume, and l is the path length. Such miniaturization issues are exemplified by the 70 fT/$\sqrt{Hz}$ sensitivity obtained with a micro-fabricated mm-size OPM, a sensitivity about 100 times worse than that of cm-size OPMs, 0.5 fT/$\sqrt{Hz}$, in qualitative agreement with the reported scaling. In addition, the finite thickness of the cell and heat insulating material, not to mention optical design constraints, can substantially increase the stand-off distance for smaller cells, making the miniaturization approach even less effective.

Accordingly, an improved approach to micro-imaging that does not require a significant tradeoff between resolution and sensitivity may be beneficial.

SUMMARY

Certain embodiments of the present invention may provide solutions to the problems and needs in the art that have not yet been fully identified, appreciated, or solved by conventional micro-imaging solutions. For example, some embodiments pertain to an ultra-sensitive atomic magnetometer (AM), such as an optically pumped magnetometer (OPM), with flux guides (FGs), such as high permeability FGs. This combination provides both high resolution and high sensitivity that are required for certain microscopic applications. Such embodiments may be non-cryogenic, greatly reducing the cost as compared to other approaches, such as SQUIDs. For instance, OPMs based on lasers and alkali-metal vapor cells are currently the most sensitive non-cryogenic magnetic field sensors, and cm-size spin-exchange relaxation free (SERF) OPMs may be used in conjunction with FGs in certain embodiments.

Due to the inverse quadratic scaling of the sensitivity arising from the magnetic flux conservation in FGs, this approach is a more effective solution for reaching extremely small resolution than the miniaturization of the OPM since the ultimate resolution is determined by the size of FGs tips. With improved microfabrication techniques, an FG-OPM could reach atomic-scale resolution. In addition, a 1-cm size OPM is now commercially available, making this approach suitable for fast commercialization. In terms of sensitivity, the performance will be limited both by the magnetic noise of FGs at low frequencies and the sensitivity of the OPM at high frequencies, as will be detailed later herein.

Performance of a FG-OPM device was investigated using experimental and numerical methods, and it was demonstrated that an optimized device can achieve a unique combination of high resolution (80 μm) and high sensitivity (8.1 pT/$\sqrt{Hz}$). In addition, numerical calculations of the magnetic field distribution in the FGs were performed to estimate the magnetic noise originating from the domain fluctuations in the material of the FGs.

Certain embodiments may have various useful applications including, but not limited to, nanoparticle detection, detection of the magnetic field of a single neuron, non-destructive testing, etc. Detection of a single neuron is an important milestone in neuroscience. The FGs, which guide magnetic flux as fiber optic tapers, may be arranged in a matrix that produces a magnified image of the desired magnetic field at a location convenient for measurement. The FGs serve to transmit the target magnetic flux to the AM, thus improving both the resolution and sensitivity to small magnetic objects, such as neurons. The FG+AM device of some embodiments enables the unprecedented combination of high resolution (e.g., 100 μm or better depending on FG geometry), high sensitivity (e.g., ~1 pT/$Hz^{1/2}$), and fast parallel imaging. Such embodiments may achieve this performance with a technology that non-cryogenic and robust. Advances in AMs and the novel FG+AM concept may enable these embodiments. FG+AM devices of some embodiments may be applied it to problems in fields including, but not limited to, security, medicine, and industry.

In an embodiment, an apparatus includes an AM and an array of FGs configured to act as a magnetic lens that expands microscopic magnetic distribution to match dimensions of the AM.

In another embodiment, an apparatus includes an atomic cell and a matrix of FGs proximate to the atomic cell constructed by combining multiple ferrite rods or bars that are sharpened to a requisite resolution.

In yet another embodiment, an FG-OPM microscope includes a plurality of MnZn (MN60) ferrite FGs and a centimeter-scale OPM comprising a Rb vapor cell located in a center of a gap between the FGs.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
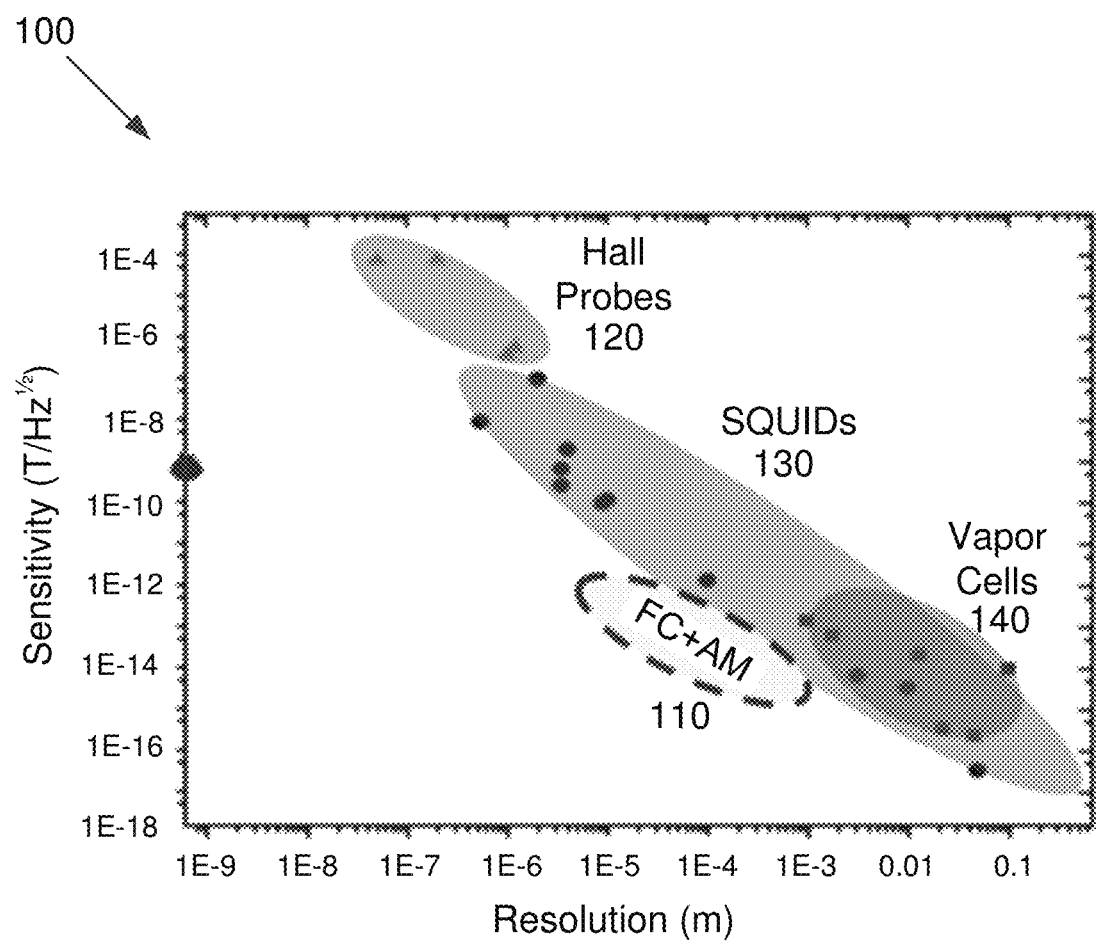
FIG. 1 is a graph illustrating resolution and magnetic sensitivity of current magnetometer approaches and FG+AM, according to an embodiment of the present invention.
Figure 2:
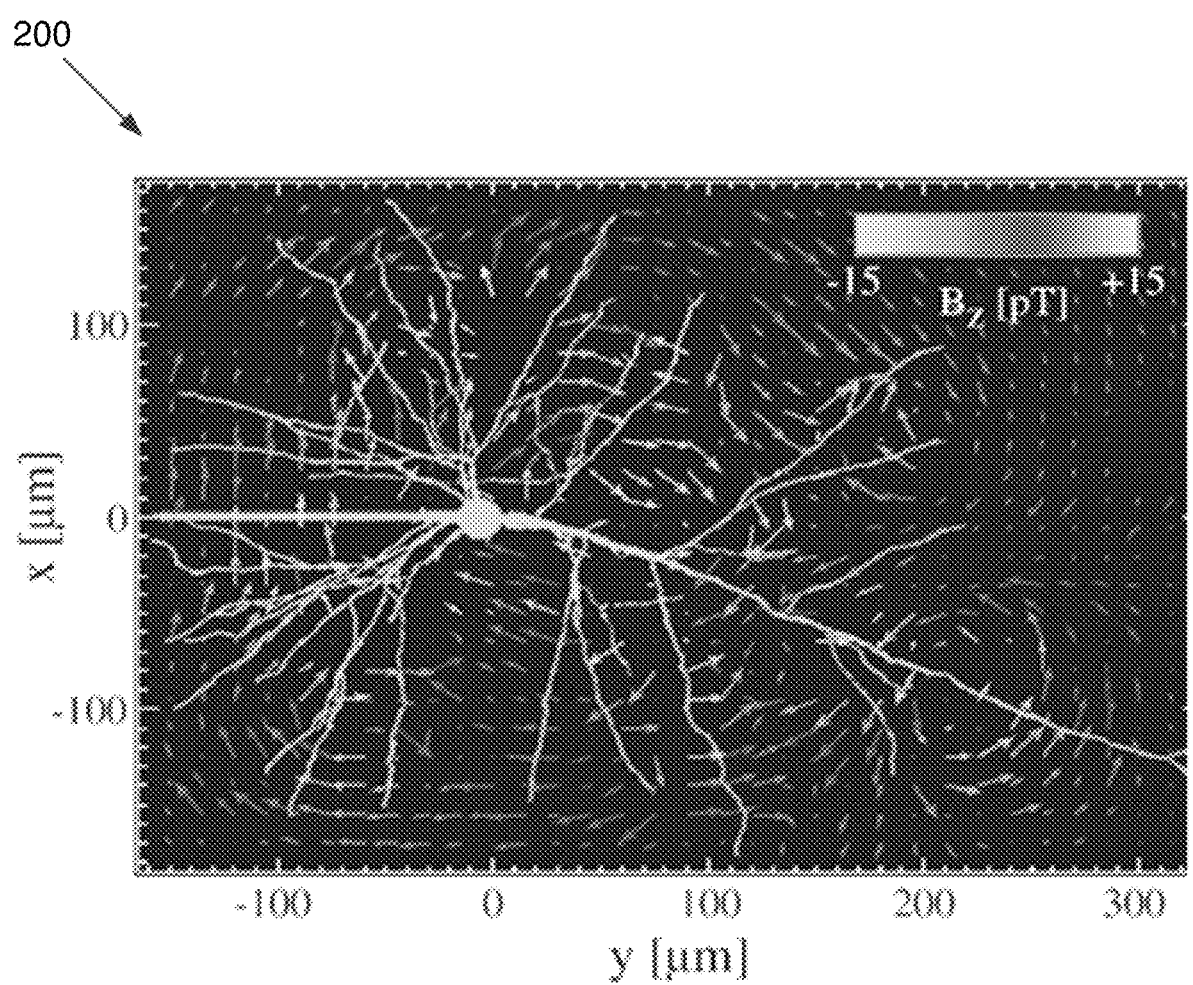
FIG. 2 is a screenshot illustrating the simulated magnetic field of a single neuron.

Some embodiments of the present invention pertain to an FG+AM magnetometer that is capable of achieving improved resolution and sensitivity without the significant tradeoffs therebetween required by current techniques. By moving into the currently inaccessible FG+AM region 110 in graph 100 of FIG. 1, an FG+AM magnetometer may enable MEG at the single or few neuron level—a new capability that is called micro-MEG herein. In other words, Hall probes region 120, SQUIDs region 130, and vapor cells region 140 cannot achieve the combination of resolution and sensitivity that can be achieved by FG+AM. This capability is aligned well with a strategic direction in President Obama's BRAIN initiative (funding level $300 million per year for 10 years). The development of FG+AM devices may produce a revolutionary impact in important areas of ultrasensitive magnetic microscopy, such as brain function. Due to substantial leveraging of previous work on AMs and the relatively low cost of microfabrication, dramatic progress may be achieved for considerably less cost than cryogenic SQUIDs systems. Since the needs of neuroscience are important to some embodiments, that application is discussed in more detail herein. However, one of ordinary skill in the art will understand that embodiments are applicable to other applications, and the discussion of neuroscience is provided by way of example only without limiting the scope of the invention.

Understanding the structure and function of the brain at different scales is important to many applications, such as neurosurgical planning, establishing the neurological basis of epilepsy, Alzheimer's research, stroke research, development of diagnostic methods, drugs, and treatments, and the study of cognitive and perceptual responses. Microscopic resolution is needed for full understanding because the dynamics observed at the macroscopic scale originate at the microscopic level. Functional domains of 0.3-0.6 mm, in which neurons show coherent responses, are particularly attractive for FG+AM applications. Many important problems remain unsolved at that scale. For instance, it is unclear whether cortical columns have distinct anatomical boundaries or are purposely composed of "mini-columns."

Small animals are widely used in neuroscience research because fundamental brain function work can be done in correlation with other invasive methods. Animals are also essential for studies of diseases and treatments, such as for drug evaluation before human trials where brain response can be studied directly. The relatively small brain size in these subjects increases the requirement for high resolution, and FG+AM would provide a significant benefit to such studies.

Furthermore, in addition to invasive micro-MEG, FG+AM also provides benefits for non-invasive micro-MEG, and establishes a new research field of small animal bio-magnetism and brain micro-magnetism. Invasive FG+AM micro-MEG provides microscopic resolution, although it may require the usual surgical procedure to open or to thin the skull. The method can be used to investigate the origins of the MEG signal at the level of single neurons and neuronal domains. FG+AM can also be uniquely used for the magnetic imaging of brain slices and cultural neuronal networks, important for developing computational algorithms.

There are also other applications beyond neuroscience for a high sensitivity, high resolution magnetic microscope. Detection of magnetic nanoparticles may be used in drug delivery and diagnostics. Another potential application is the authentication of integrated circuits (ICs) and the detection of counterfeit or tampered parts, where current methods are destructive. While the scale of the current elements on complex ICs is below the μm-scale resolution of FG+AM, it may be possible to authenticate ICs by their external magnetic field "fingerprint." Non-destructive evaluation (NDE) and fuel cell applications are also possible. For instance, NDE with FG-AM can reveal defects using either natural magnetic properties of materials or magnetic fields induced by applied currents, AC magnetic fields (eddy currents), and other methods. FG-AM can also be used for diagnostics of fuel cells promising to revolutionize automotive industry and reduce greenhouse gas emission. Ion-transport non-uniformity transport studied invasively with electrodes can be supplemented with non-invasive magnetic measurements.

Principles of Atomic Magnetometry

Figure 3:
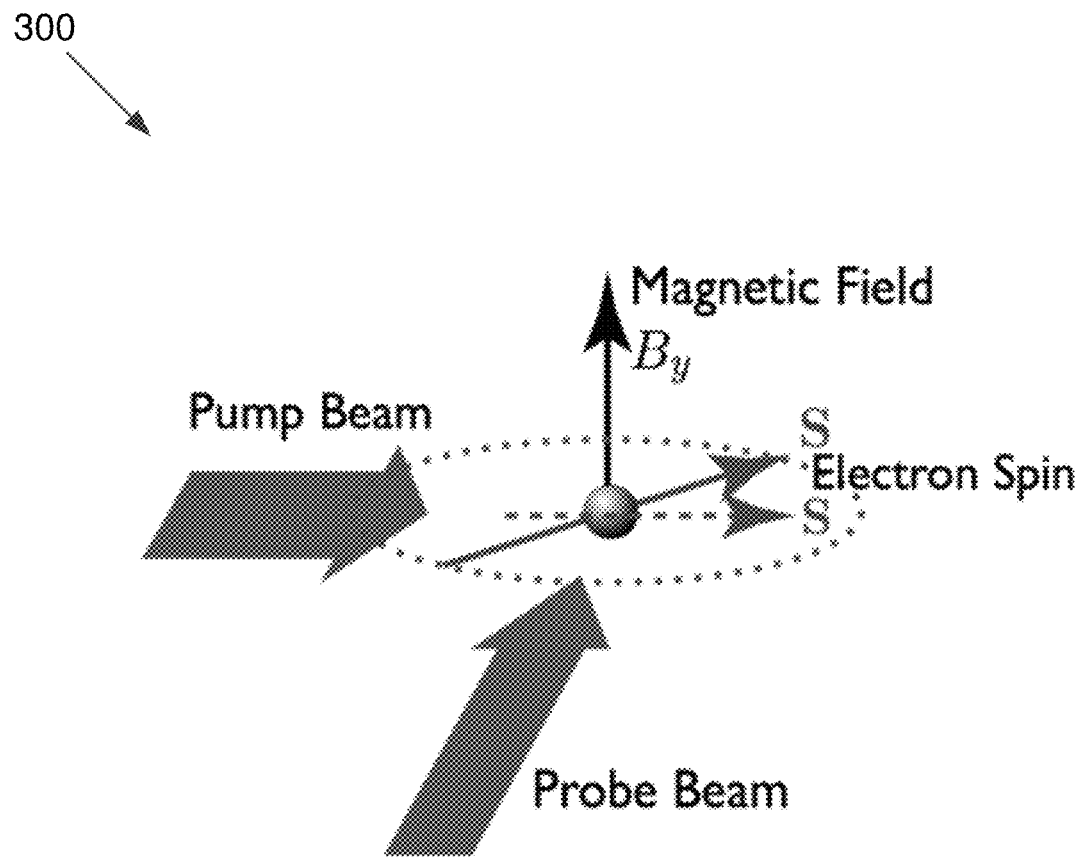
FIG. 3 illustrates a vapor cell AM configuration.

To better understand the operation of FG+AM, it may be beneficial to review how an AM works. A circularly polarized "pump beam" pumps a cloud of atomic spins into the "stretched" state, and a linearly polarized "probe beam" probes the state of the spins. As seen in vapor cell AM configuration 300 of FIG. 3, the pump laser beam and the probe laser beam overlap a vapor of alkali-metal atoms. The pump beam orients spins along its direction. The interaction of the magnetic field with the spins leads to changes in their orientations, tilting the spins. This change in orientation is detected through its effect on the polarization of the probe beam.

The sensitivity of an AM scales with the number of active atoms N and the time $T_2$ for which the spins evolve coherently as $(NT_2)^{1/2}$. Conventional AMs use alkali vapor cells, in which case the spin coherence time $T_2$ is limited by depolarizing collisions of the atoms with each other and with the walls of the cell. These AMs have demonstrated considerable sensitivity. See graph 100 of FIG. 1.

While conventional cell-based spin-exchange relaxation free (SERF) atomic magnetometers have extremely high sensitivity (i.e., below 1 fT/Hz$^{1/2}$), this comes at the expense of the centimeter-scale resolution set by the dimensions of the vapor cell. The cell can be made smaller, but the increase in resolution is accompanied by a corresponding decrease in sensitivity. For instance, in the case of a 1×2×3 mm$^3$ microfabricated AM, the best sensitivity obtained was 70 fT/Hz$^{1/2}$. One reason that AM performance deteriorates when resolution is increased is spin-destruction in wall collisions, whose rate scales inversely with the square of the size of the cell. Instead of reducing cell dimensions to micron size, some embodiments present a more elegant and robust solution by introducing an array of FGs that would act as a magnetic field lens, expanding the microscopic magnetic distribution to match the dimensions of an AM operating with high sensitivity.

FG-OPM Probe Microscopy

Figure 4:
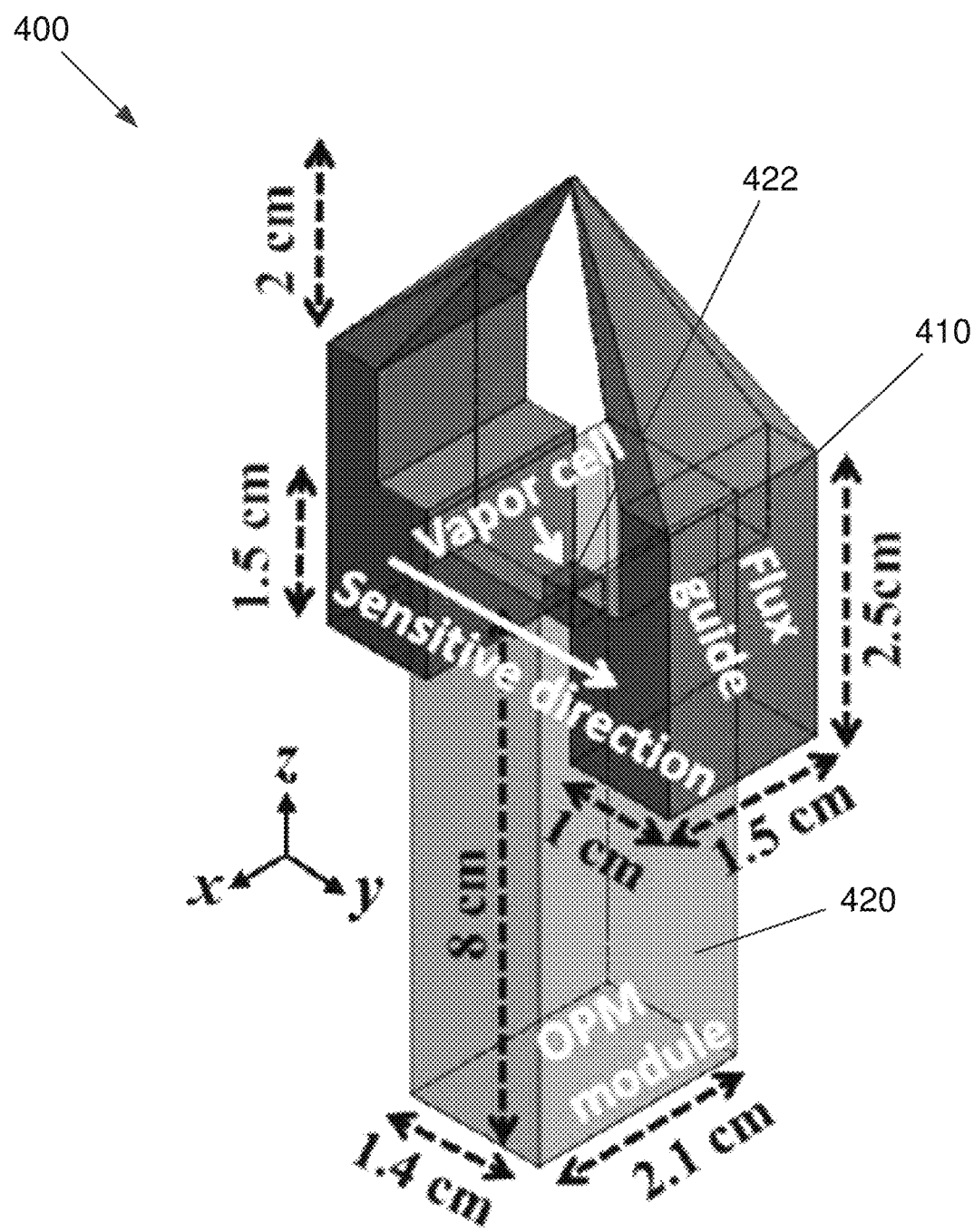
FIG. 4 is a schematic diagram illustrating an FG-OPM microscope including ferrite flux guides and a cm-scale OPM, according to an embodiment of the present invention.
Figure 5:
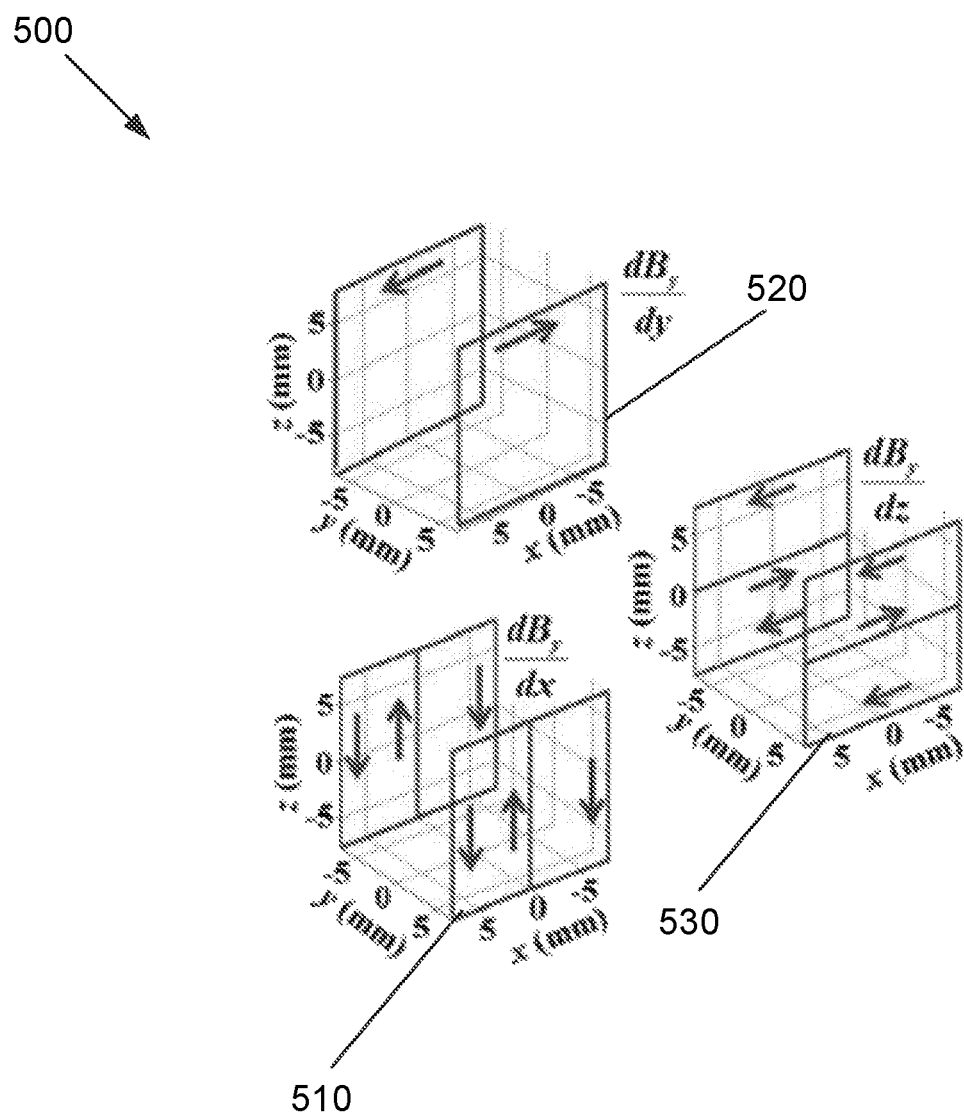
FIG. 5 illustrates field gradients for an FG-OPM with coils for compensating gradients experienced by an OPM arising from FGs, according to an embodiment of the present invention.

FIG. 4 is a schematic diagram illustrating an FG-OPM microscope 400 including ferrite FGs 410 and a cm-scale OPM 420, according to an embodiment of the present invention. A 3×3×3 mm³ Rb vapor cell 422, purchased from QuSpin Inc.™, is located in the center of the larger gap of FGs 410. In order to avoid large magnetic Johnson noise, FGs 410 were made of an electrically poorly conductive, high permeability (6500 at 10 kHz) MnZn (MN60) ferrite, provided by Ceramic Magnetics Inc.™ Vapor cell 422, which defines the sensing volume, was located relative to FGs 410 as shown in FIG. 1.

The magnetic targets were placed near the probe tips so that magnetic flux from the target was transmitted towards OPM vapor cell 422 through FGs 410, and the y component of the target's field was measured. Because OPM 420 operates in the SERF regime, in which there is no DC field across cell 422, no flux is transmitted from cell 422 to the target. This is important for passive reading from magnetic storage devices to prevent the field from cell 422 from writing to the device.

The sensitivity of a FG-OPM was investigated inside a cylindrical ferrite shield with end-caps (18 cm diameter and 38 cm tall) inserted into a three-layer open mu-metal co-axial cylindrical shield (23 cm inner diameter, 29 cm outer diameter, and 69 cm tall). This combined shield provided sufficient suppression of the external DC field and magnetic noise, but the residual field inside the ferrite shield was compensated with three orthogonal coils and a complete set of five first-order gradient coils positioned inside the shield. For sensitivity tests of an FG-OPM, several gradient coils in the OPM gap of FGs were added to compensate for the residual field and gradients created by the FGs. See FIG. 4 for an example FG-OPM. More specifically, the gradient coils compensate for a $dB_y/dx$ gradient 510, a $dB_y/dy$ gradient 520, and a $dB_y/dz$ gradient 530. In particular, dominant $dB_y/dz$ gradient 530 was suppressed by a factor of 100 with the $dB_y/dz$ gradient coil. A square Helmholtz coil with 2.5 cm sides was mounted near the vapor cell to generate a calibration field in the y direction at 80 Hz in order to convert the output voltage spectrum of the OPM into the magnetic field spectrum. A magnetic target of interest is positioned near the probe tips and its magnetic flux is guided to the vapor cell in the y direction.

Figure 6A:
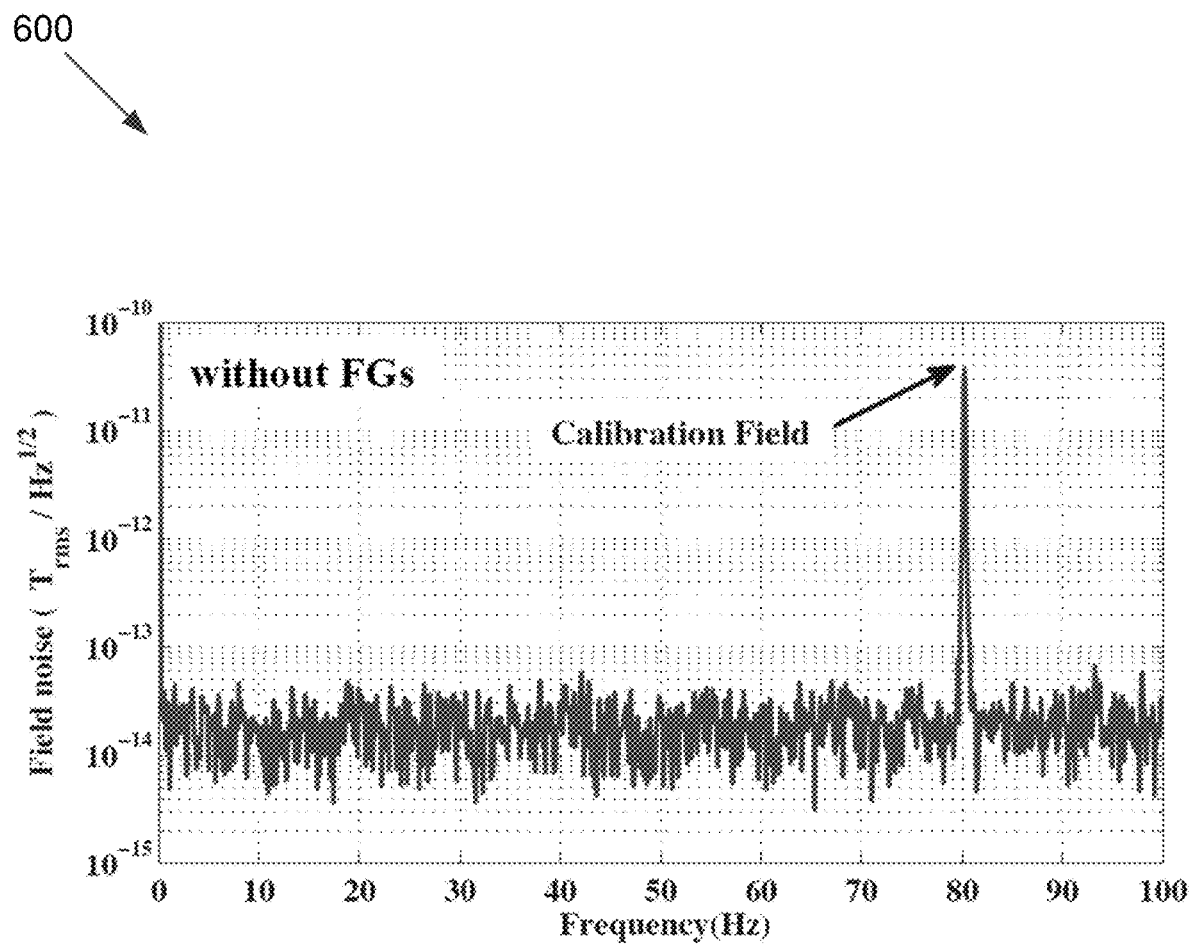
FIG. 6A is a graph illustrating the calibrated field noise spectrum of an OPM without FGs, demonstrating its intrinsic sensitivity, according to an embodiment of the present invention.

FIG. 6A is a graph 600 illustrating the calibrated field noise spectrum of an OPM without FGs, demonstrating its intrinsic sensitivity, averaged from 65 Hz to 78 Hz, of 19.7 fT/√Hz, according to an embodiment of the present invention. The bandwidth of the OPM was measured to be 137 Hz. The calibrated magnetic field noise was measured inside a cylindrical ferrite shield, inserted into a three-layer open mu-metal co-axial cylindrical shield, that included compensation coils to remove ambient DC fields. A uniform calibration field at 80 Hz was applied in the y direction to convert the measured voltages into magnetic fields. Since these measurements were taken, QuSpin™ has improved the sensitivity of its sensors to 10 fT/√Hz, and it is expected that the performance may be improved in the future by upgrading the first model.

Figure 6B:
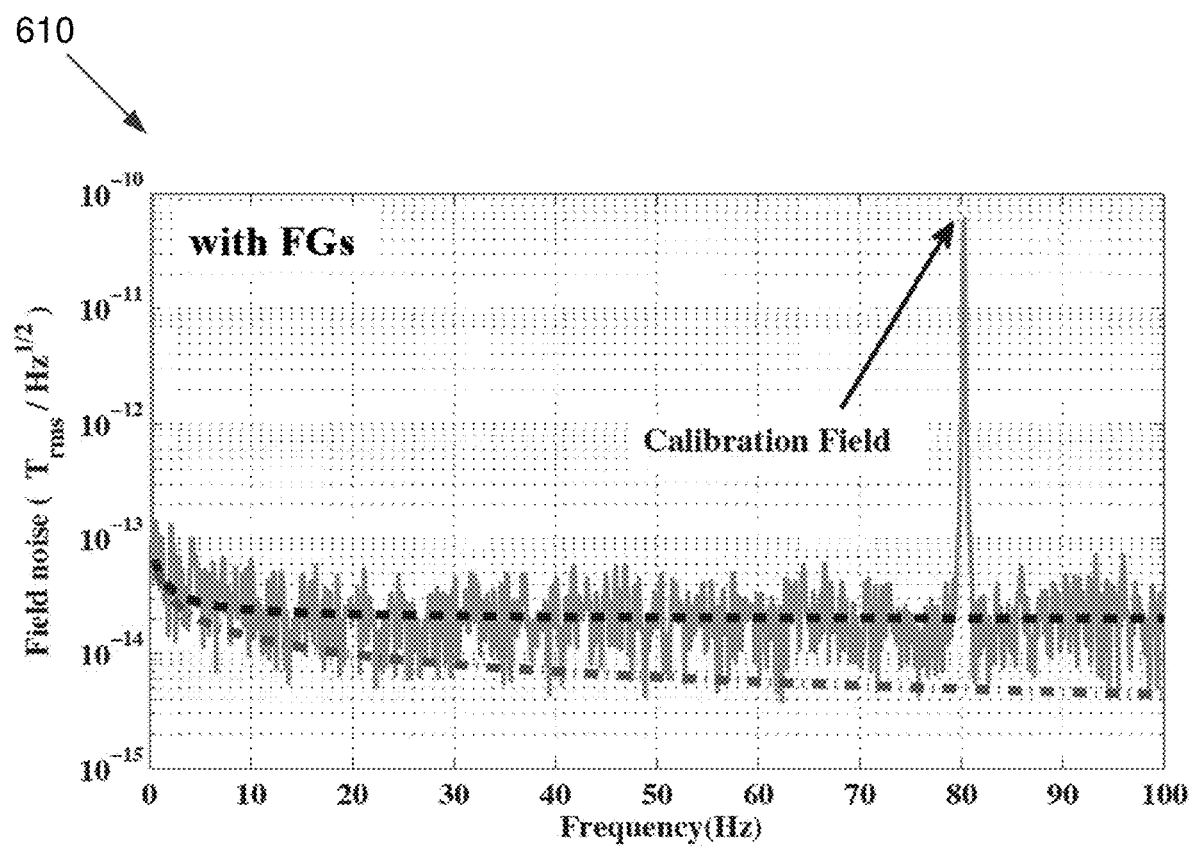
FIG. 6B is a graph illustrating the calibrated field noise spectrum of the combined FG-OPM, according to an embodiment of the present invention.

FIG. 6B is a graph 610 illustrating the calibrated field noise spectrum of a combined FG-OPM, according to an embodiment of the present invention. The OPM was tuned by adjusting compensation and the gradient coils to optimize signal strength from a small oscillating calibration field. The bigger calibration field strength in FIG. 6B is due to field enhancement by FGs. The calibrated noise spectrum takes this factor into account. The intrinsic sensitivity of the OPM and the combined FG-OPM, averaged from 65 Hz to 78 Hz, was 19.7 fT/√Hz and 20.2 fT/√Hz, respectively. In FIG. 6B, the upper dashed line shows the estimated total magnetic noise of the FG-OPM and the lower dashed line shows the estimated thermal magnetic noise originating from the FGs.

The minimum separation between the probe tips was set at 50 μm. The intrinsic sensitivity of the FG-OPM was measured to be 20.2 fT/√Hz z averaged from 65 Hz to 78 Hz, with a bandwidth of 147 Hz, performance which is very close to that of the OPM without the FGs. The results imply that the addition of the FGs did not significantly impair the performance of the OPM once the residual field and gradients of the FGs were properly compensated.

Figure 7:
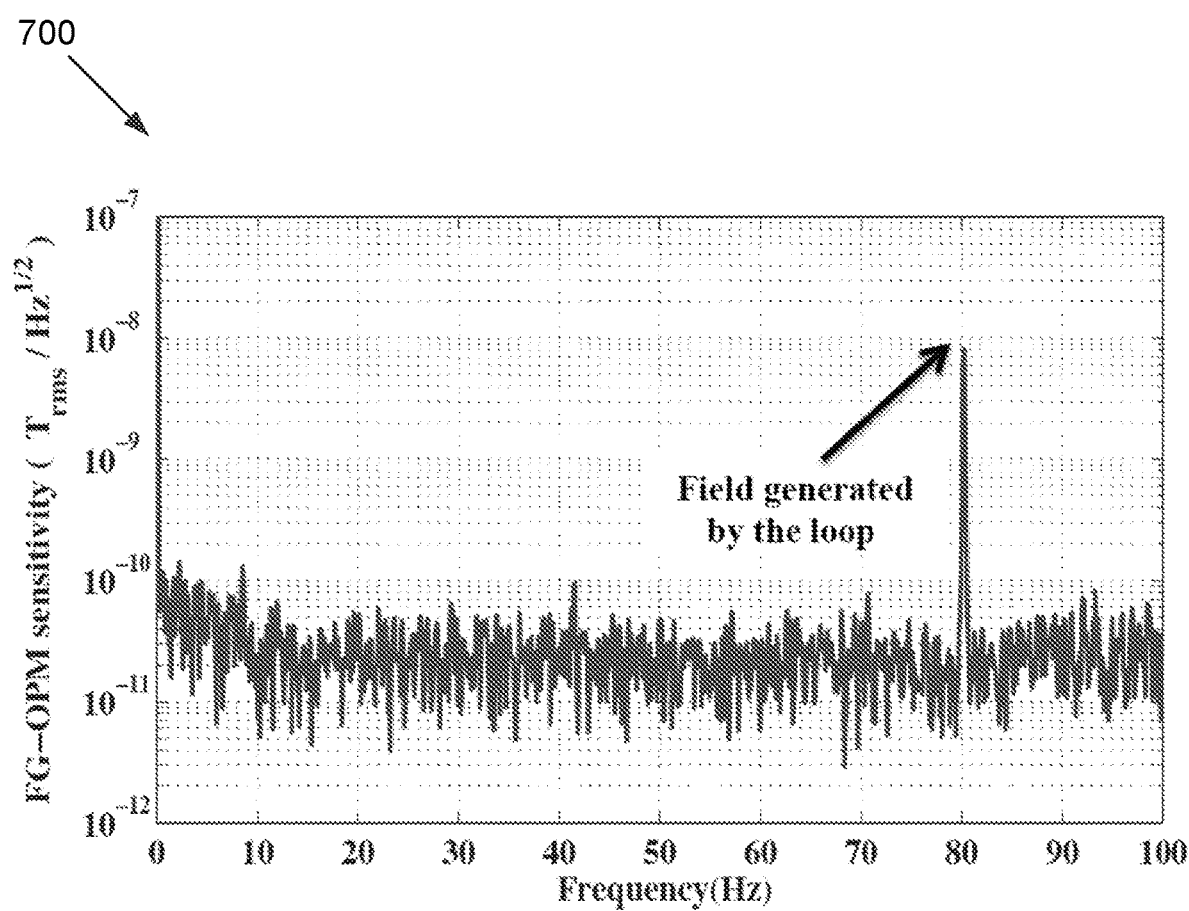
FIG. 7 is a graph illustrating FG-OPM sensitivity to a small magnetic object near the probe tips, according to an embodiment of the present invention.

To determine the FG-OPM sensitivity to a magnetic source located near the probe tips, which is an important characteristic of the microscope, a small 0.75 mm-diameter current loop was placed between the tips. See graph 700 of FIG. 7, which illustrates FG-OPM sensitivity to a small magnetic object near the probe tips. The magnetic field sensitivity of the FG-OPM to a magnetic target near the tips was measured with a 0.75 mm-diameter current loop placed between the tips. A field generated by the loop was detected with the FG-OPM and the FG-OPM output spectrum was calibrated to the field strength of the calibration field. Knowing the absolute field strength generated by the loop at 80 Hz allowed calibration of the field spectrum of the FG-OPM. The ratio of the measured field to the generated field was $8.7 \times 10^{-4}$, which results in an FG-OPM sensitivity of 23 T/√Hz.

Figure 8A:
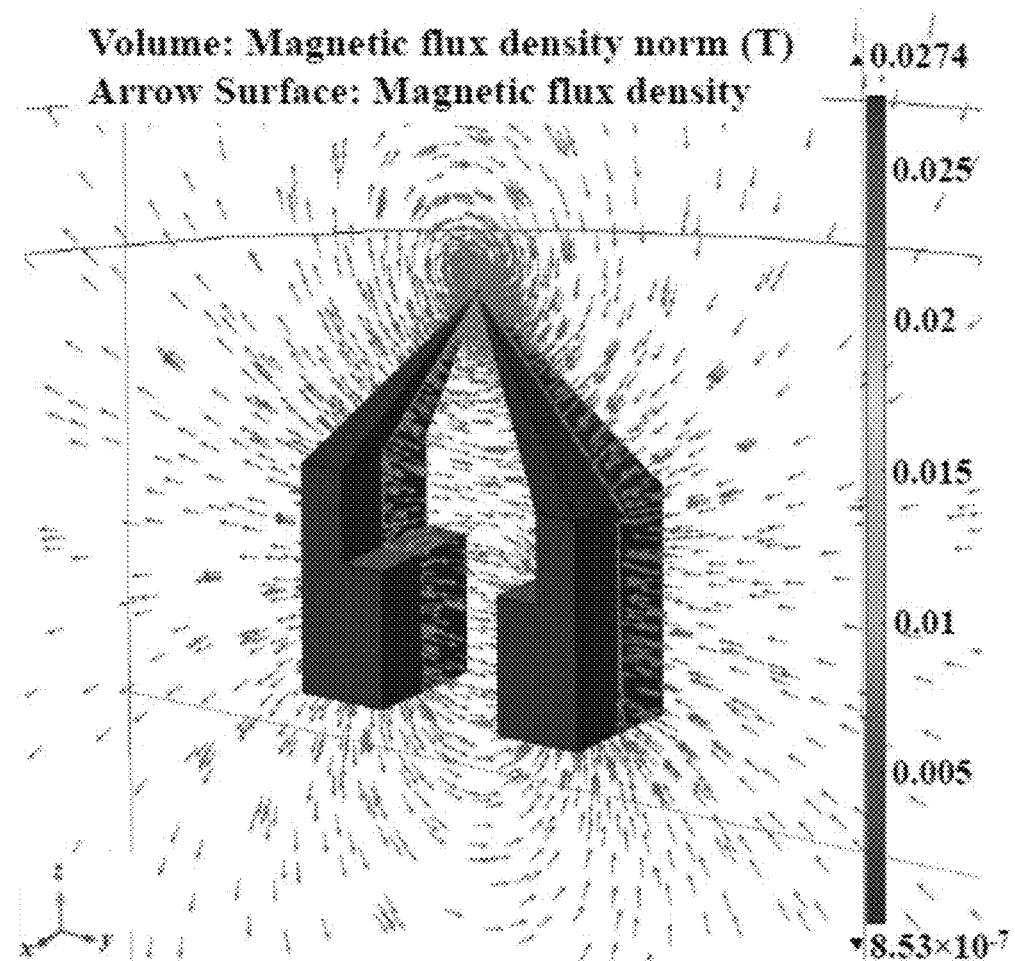
FIG. 8A is a magnetic field distribution in the FGs visualized by field lines, according to an embodiment of the present invention.
Figure 8B:
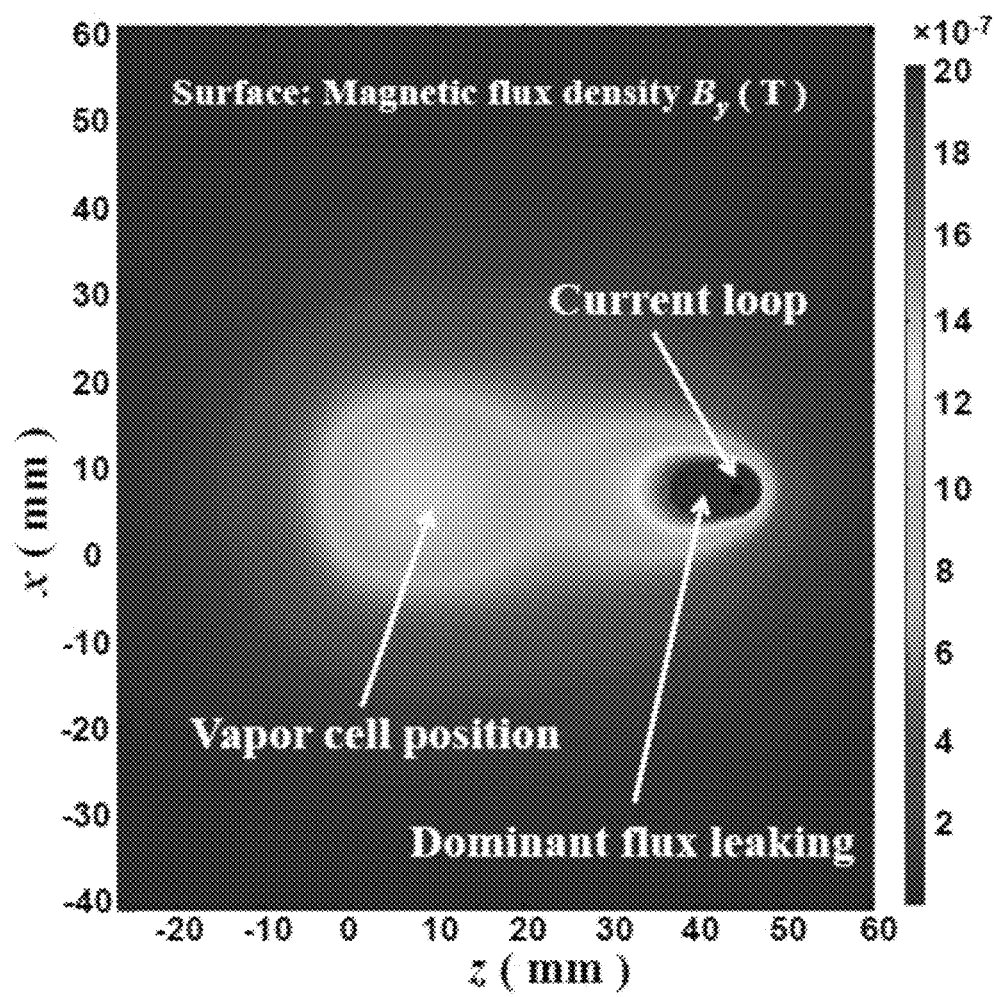
FIG. 8B is a two-dimensional projection of $B_y$ onto the xz plane at the center of FGs, according to an embodiment of the present invention.

In order to examine how the FGs transmit the magnetic flux generated from the current loop and theoretically analyze the sensitivity, several three-dimensional simulations were performed using finite element analysis software (COM-SOL Multiphysics 4.3). As indicated in magnetic field distribution 800 of FIG. 8A and two-dimensional projection 810 of FIG. 8B, simulations revealed that the magnetic flux leaked predominantly near the probe tips. This leads to a loss in flux and a reduction of the field detected by the OPM.

Figure 8C:
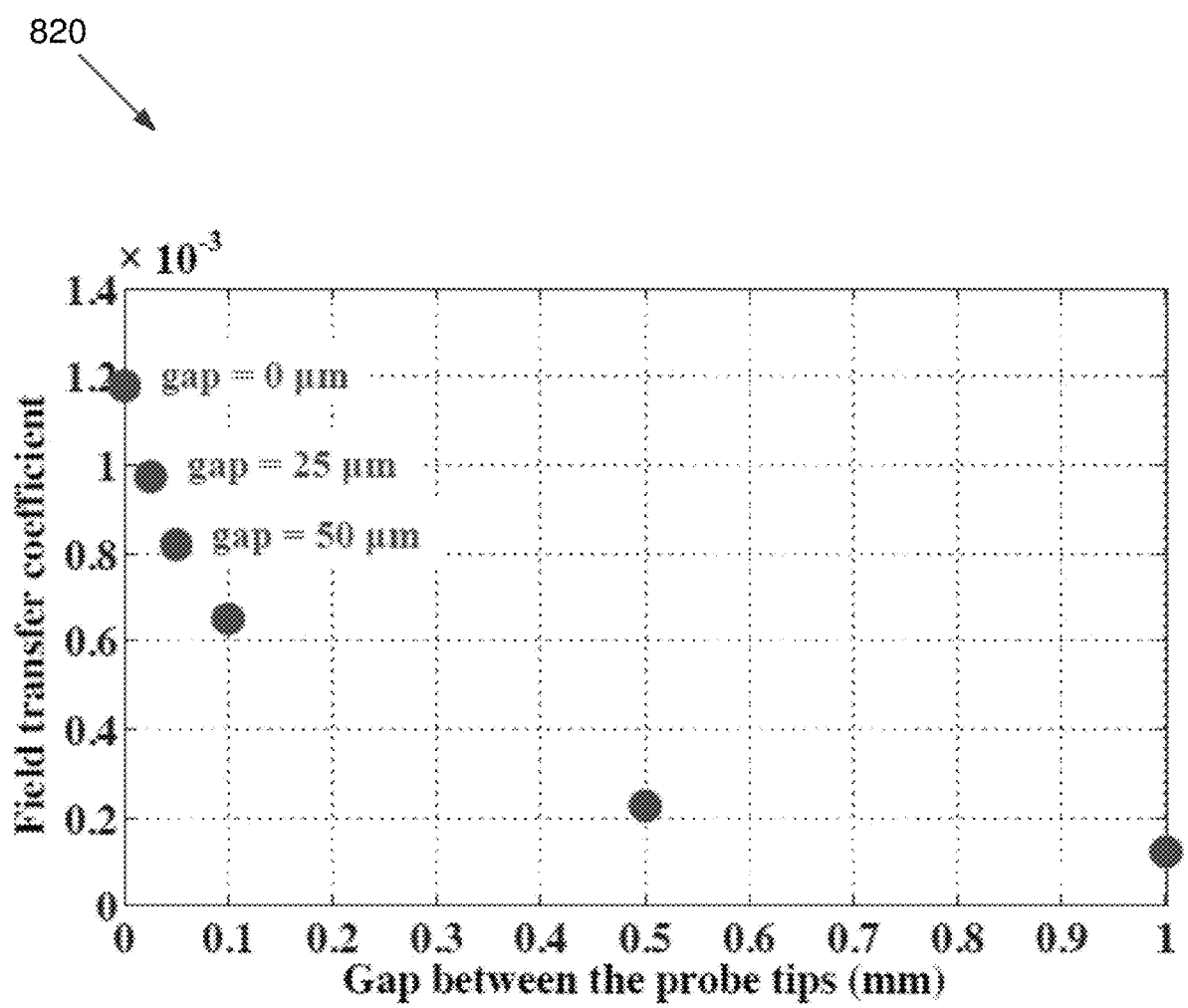
FIG. 8C is a graph illustrating calculated field transfer coefficient vs. gap between the probe tips, according to an embodiment of the present invention.

Graph 820 of FIG. 8C shows the calculated field transfer coefficient as a function of the gap between the probe tips. The theoretical result of $8.3 \times 10^{-4}$ agrees well with the experimental result of $8.7 \times 10^{-4}$ for the tips gap of 50 μm (5% agreement). Because the flux predominantly leaks out around the probe tips, the optimization of the tips should provide further sensitivity improvement. The simulations also show that the field transfer coefficient can be improved by a factor of two when the separation between the FGs at the OPM end (currently about 1.4 cm) is decreased by a factor of two. This was not attempted with the current OPM since it would have required a redesign of the sensor head.

The thermal magnetic noise originating from the FGs was estimated using the equations derived from the fluctuation dissipation theorem, given by:

$$\delta B = \frac{\sqrt{4kT}\sqrt{2P}}{A l 2\pi f}$$

Where k is the Boltzmann constant, T is the absolute temperature, P is the power loss, and f is the frequency at which noise is considered. For the weakly conductive NM60 ferrite ($\sigma=0.2\Omega^{-1}$ m$^{-1}$), the power loss is dominated by hysteresis losses, $P=\int_V \frac{1}{2}\pi f \mu'' H^2 \, dV$, where $\mu'$ and $\mu''$ are the real and imaginary parts of the complex permeability $\mu=\mu'-i\mu''$ and H is the magnetic field generated by a hypothetical excitation coil (1 turn, small area A, and current I) placed in the position of the noise measurement. The integration is carried out over the total volume of the FGs using the simulated fields. The value of $\mu''$ ($\mu''/\mu_0 \cong 26$) was adopted because the same ferrite material (MN60) was used.

The magnetic noise from the FGs in the vapor cell location was estimated to be $44.2 f^{-1/2}$ fT$\sqrt{HZ}$ at 300 K. The predicted magnetic noise is 44 fT$\sqrt{HZ}$ at 1 Hz and 5 fT$\sqrt{HZ}$ at 80 Hz. The lower dashed line and upper dashed line in graph 610 of FIG. 6B show the estimated FG noise $\delta B_{FG}$ and the total magnetic noise $\sqrt{\delta B_{OPM}^2 + \delta B_{FG}^2}$, respectively, where $\delta B_{OPM}$ is the noise of the OPM. This means that at low frequencies, the noise is dominated by $\delta B_{FG}$, while at high frequencies, the noise is dominated by $\delta B_{OPM}$. Thus, at low frequencies, the sensitivity can be improved through better FG design or by cooling the ferrite material, while at high frequencies, improvement in sensitivity should focus on the OPM design.

Figure 9A:
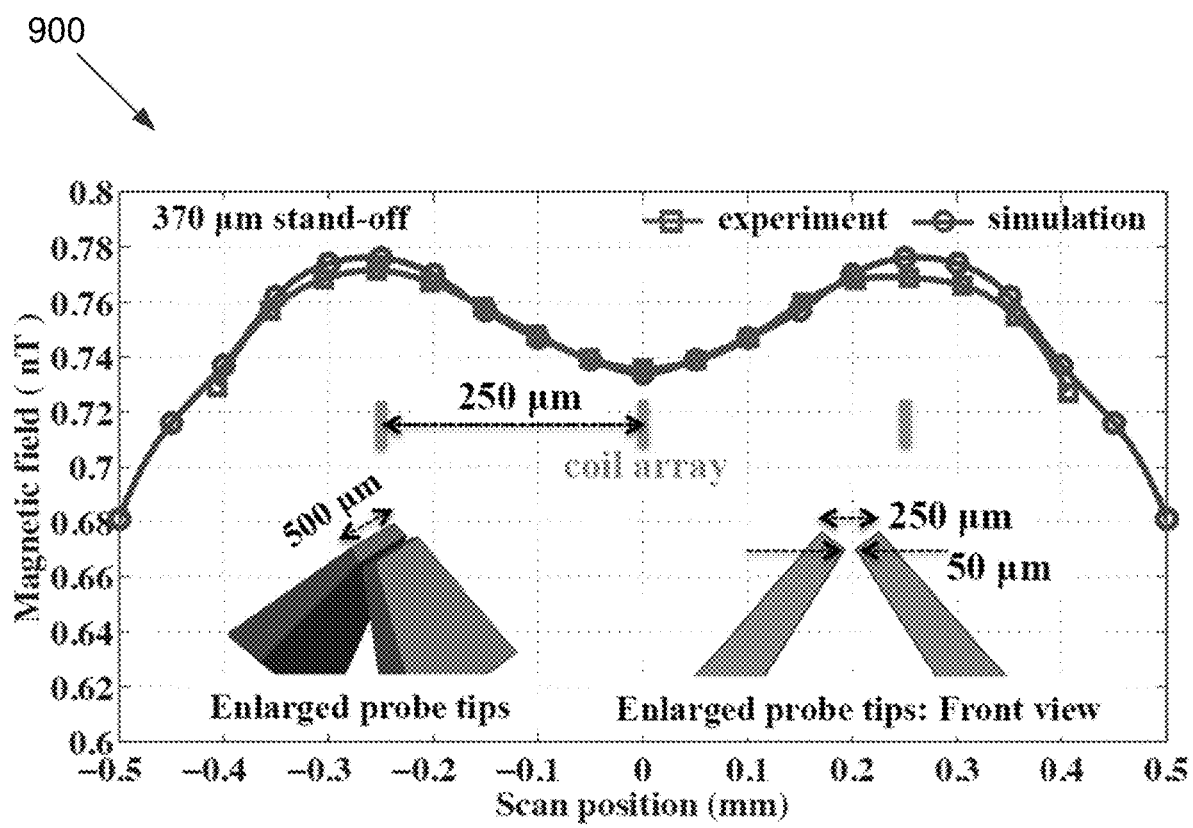
FIG. 9A is a graph illustrating experimentally measured and numerically calculated magnetic fields at the position of the vapor cell as a function of tip position, according to an embodiment of the present invention.

The resolution of the FG-OPM was investigated both experimentally and numerically by scanning the position of an array of three one-turn 0.75 mm-diameter coils at specific stand-off distances from the probe tips. In the experiment, a 80 µm (40 gauge) wire was used for the coil array to carry the 56 mA current. The direction of the current in the middle coil was reversed. The limit of resolution achievable with the manufactured FG tips was sought by varying the coil separation distances and then finding the conditions where the three coils were clearly discernible in the observed signal. The inset of graph 900 of FIG. 9A shows the enlarged FG probe tips and their specific dimensions.

Due to the brittle nature of the ferrite, these tips were the best that could reasonably be manufactured. The stand-off distance was difficult to measure directly, but was determined to be 370 µm by comparing the data to the simulations. The measurements and simulations, which clearly observed two maxima and one minimum for the coil separation of 250 µm, shown in FIG. 9A, showed that the best resolution was 250 µm and that it was limited by the upper tip gap. Since the simulation reproduced the experimental results, further analysis of resolution and sensitivity with optimized FGs was conducted solely through numerical simulations.

Figure 9B:
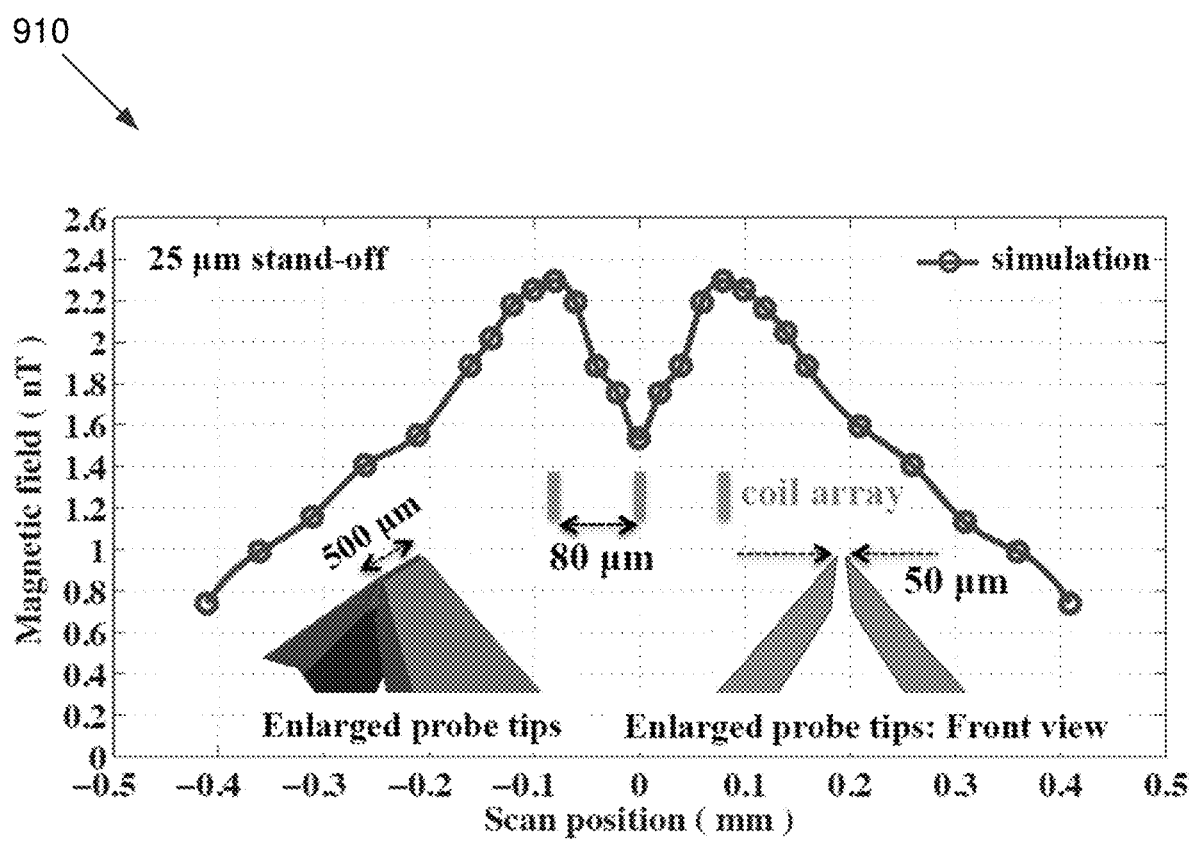
FIG. 9B is a graph illustrating simulated magnetic fields based on scan position, according to an embodiment of the present invention.

In order to investigate the significance of the tip geometry, the model of the probe tips was modified as shown in FIG. 9B, with the upper tips made sharper and the gap reduced to 50 µm. With the stand-off of the coil array at 25 µm, the wire diameter set to 40 µm, and the direction of the 56 mA current in the middle coil reversed, it was found that the resolution for this configuration was better than 80 µm. As shown in FIG. 9B, two maxima and one minimum can clearly be observed for an 80 µm coil separation. The expected field transfer coefficient for the newly designed FGs is $1.23 \times 10^{-3}$, which is 40% better than that of the FGs that were experimentally tested. With the improved OPM from QuSpin™ operating at 10 fT$\sqrt{HZ}$ sensitivity, it is estimated that the sensitivity of the new FG-OPM to a magnetic source of interest located at the probe tips would improve to 8.1 pT$\sqrt{HZ}$. Thus, an optimized FG-OPM is expected to reach a resolution of 80 µm and a sensitivity of 8.1 pT$\sqrt{HZ}$, which could be sufficient to detect the magnetic field of a single neuron after about 10 to 1000 averages, depending on some specific parameters of neurons. The recovery time of neurons after a stimulation will be a determining factor in a choice of the measurement repetition time.

Per the above, preliminary experiments with AMs and FGs have been performed, supplemented by theoretical analysis and modeling. The sensitivity of a rubidium (Rb) atomic magnetometer in the single-channel configuration (see FG+AM 1000 of FIG. 10) with a small cell (1 cm) can reach the fT level. However, other suitable materials than Rb, such as potassium (K) and cesium (Cs), may be used without deviating from the scope of the invention.

Figure 10:
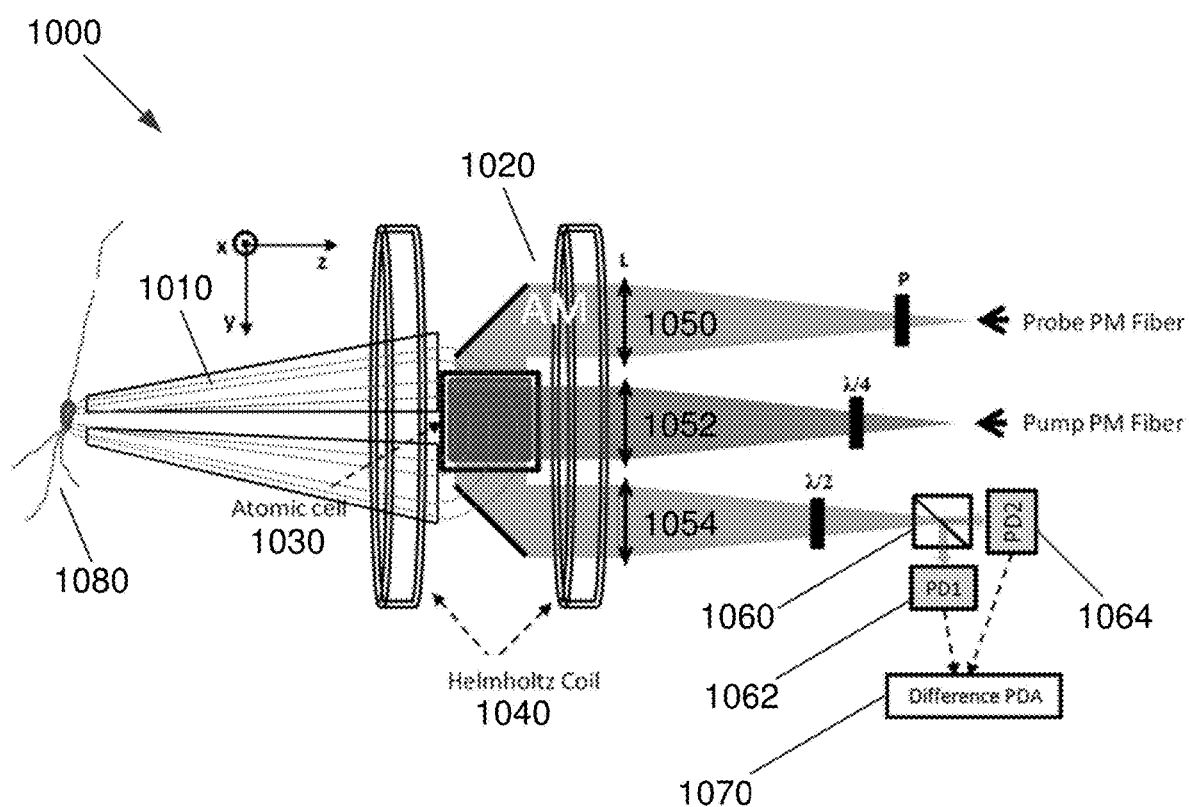
FIG. 10 is an architectural diagram illustrating a FG+AM that performs high resolution magnetic field detection, according to an embodiment of the present invention.

FIG. 10 is an architectural diagram illustrating a FG+AM 1000 that performs high resolution magnetic field detection, according to an embodiment of the present invention. In this embodiment, a Rb AM 1020 is used together with a FG 1010 for detection of the magnetic field of a single neuron 1080. Conventional flux concentrators are used to perform the opposite function of a FG (i.e., increase the size and improve the sensitivity by collecting magnetic flux from large area into a small magnetometer rather than vice versa). Thus, FG 1010 has the opposite operation of conventional flux concentrators.

After passing through a polarizer P, a linearly polarized probe beam 1050 and a circularly polarized pump beam 1052 (after passing through a λ/4 waveplate) intersect in Rb atomic cell 1030. The polarization rotation of a probe beam 1054, which is λ/2, is detected with a balanced polarimeter formed by a polarizing beam splitter 1060, two photodiodes (PDs) 1062, 1064, and difference photo-diode amplifiers (PDAs) 1070. The λ/2 waveplate serves to rotate the polarization of the light to precisely balance PDAs 1070. The bias field is generated by a Helmholtz coil 1040. Probe beam 1050 and pump beam 1052 are delivered to AM 1020 from distributed feedback (DFB) lasers with polarization maintaining (PM) fibers (not shown).

Single-channel AMs can be combined into an array to realize multi-channel operation. However, 2D multi-channel operation is also possible using a relatively large Rb pancake-shaped cell several centimeters in diameter and a half centimeter thick with a buffer gas that reduces Rb diffusion and a broad probe beam, as illustrated in Rb cell 1100 of FIG. 11. A prototype with a large Rb cell has been designed, as seen in AM 1200 of FIG. 12. Several new features have been introduced. A linearly polarized probe beam 1230 after polarizer 1224 is arranged to pass through a "pancake" atomic cell 1204 twice with the help of a retro-reflecting mirror 1202, reducing the standoff distance between the active volume of cell 1204 and the external measurement region. AM 1200 has field sensitivity in the direction of arrow 1214. The angle between probe beam 1230 and pump beam 1220, which is circularly polarized by λ/4 plate 1222, is substantially reduced to a few degrees from the conventional 90° degrees to enable good overlap inside cell 1204. Light for pump beam 1220 and probe beam 1230 is provided by pump fiber 1226 and probe fiber 1232, respectively.

The change in probe beam polarization angle, which is proportional to the measured magnetic field, is detected with high sensitivity using polarizing beam splitter 1246 and two probe photodetection systems 1242, 1244. Cell 1204 is heated by Pyrex™ heaters 1210, which are flat pieces of Pyrex™ glass on which tungsten wire is wrapped. Cell 1204 is heat-insulated by still air between Pyrex™ heaters 1210 and Pyrex™ window 1212. On other sides, the heat insulation is accommodated by wrapping the oven with porous soft heat-non-conductive materials 1208. G7 spacers 1206 hold Pyrex™ window 1212 and Pyrex™ heaters 1210 at some distance to provide room for still air.

Figure 11:
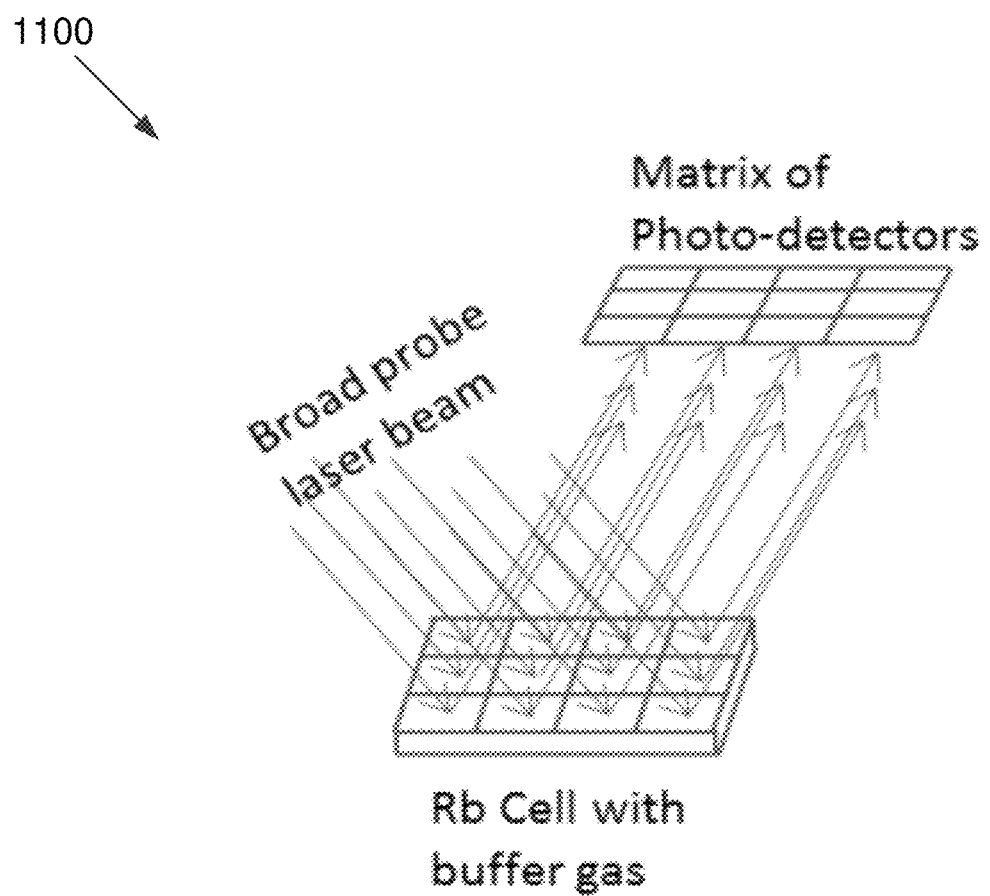
FIG. 11 is a perspective view illustrating a Rb cell with buffer gas that performs multi-channel imaging, according to an embodiment of the present invention.
Figure 12:
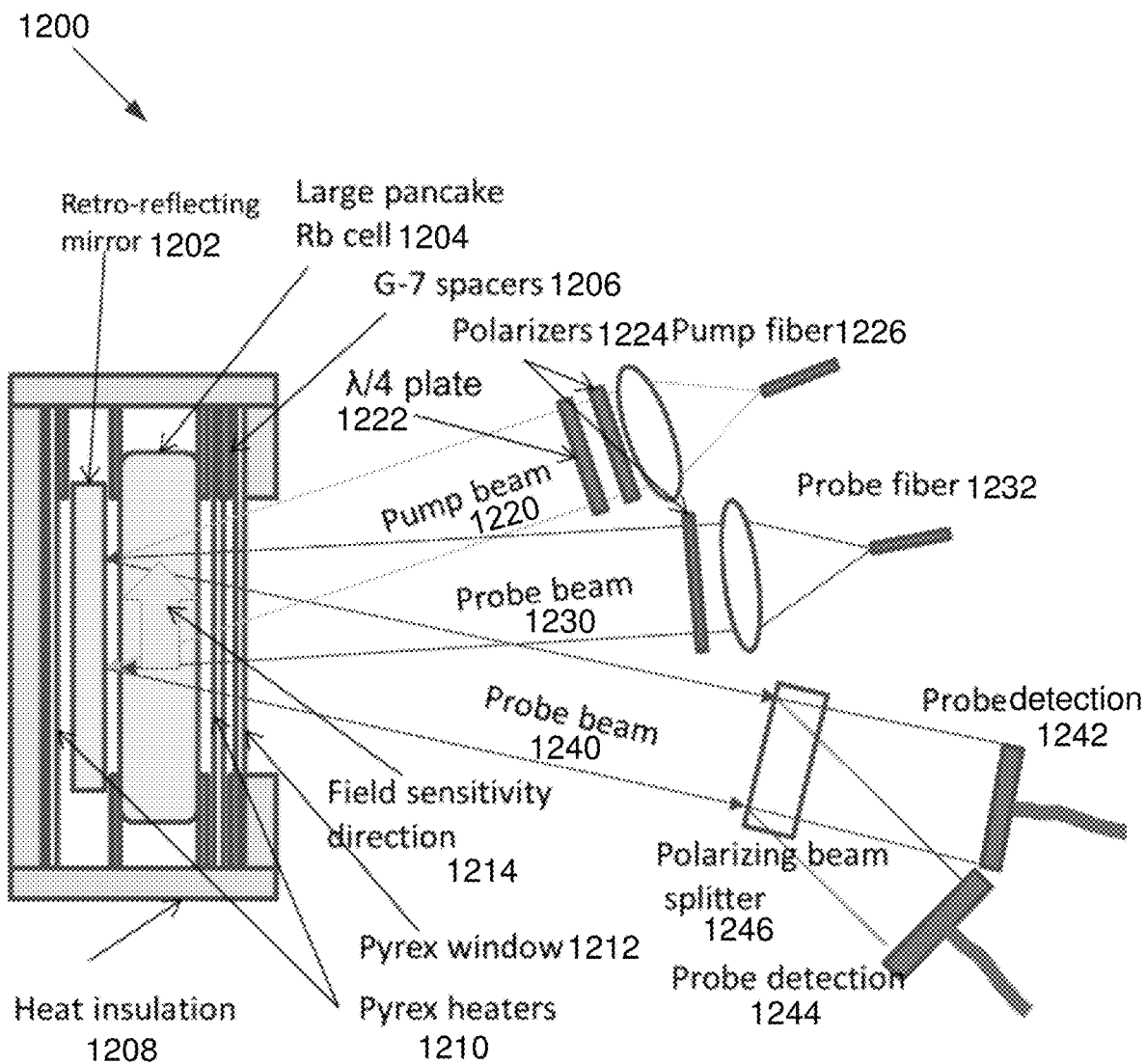
FIG. 12 is a side cutaway view illustrating a prototype AM design for a FG+AM system, according to an embodiment of the present invention.
Figure 13:
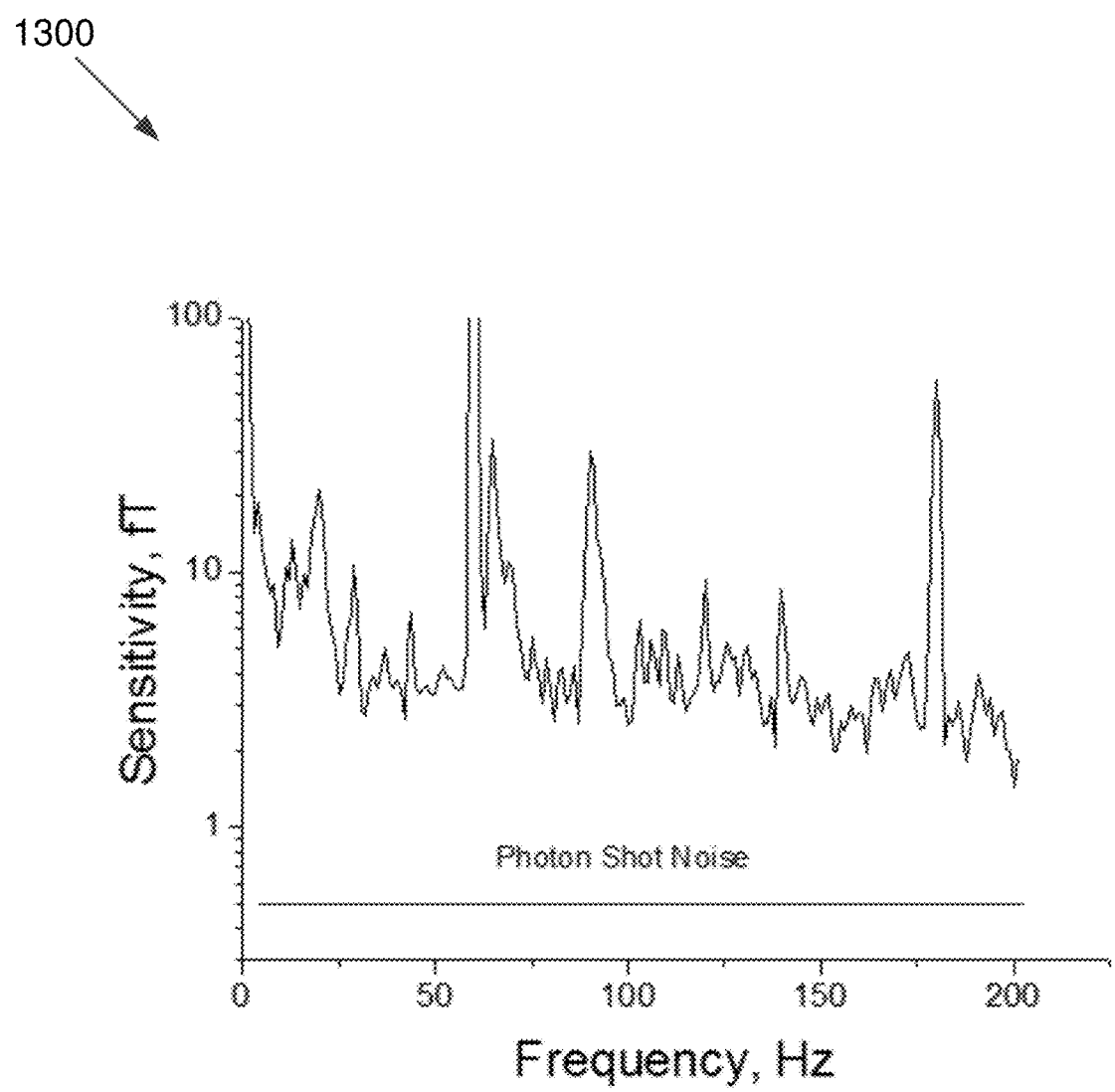
FIG. 13 is a graph illustrating a sensitivity test of the multi-channel AM of FIG. 6, according to an embodiment of the present invention.

With this prototype, a fT-level sensitivity was demonstrated for one channel (see graph 1300 of FIG. 13) for one channel, with the possibility for further improvement to the photon shot noise limit by reducing remaining technical noise. A single photodetector may be replaced with an array of photodetectors to realize multi-channel operation, as illustrated in FIG. 11.

The novel idea of increasing AM resolution with an array of FGs has also been tested. There are several potentially problematic issues: field attenuation, interaction between channels that can interfere with image reconstruction, FG noise, and negative effects of the FG on the AM. First, the field dependence on FG geometry was analyzed. Quadratic field attenuation is expected when resolution is improved. In particular, a 2D array of FG attached to an array of AMs with 1 fT sensitivity and 5 mm channels may provide 2.5 pT sensitivity with 100-micron resolution. Such sensitivity and resolution are suitable for detecting the field of a single neuron. This analysis also shows that high sensitivity AMs are beneficial for such applications. Although SQUIDs could also be used with FGs to improve resolution, the cryogenic operation and significant expense will be a serious limitation for many applications.

Figure 14:
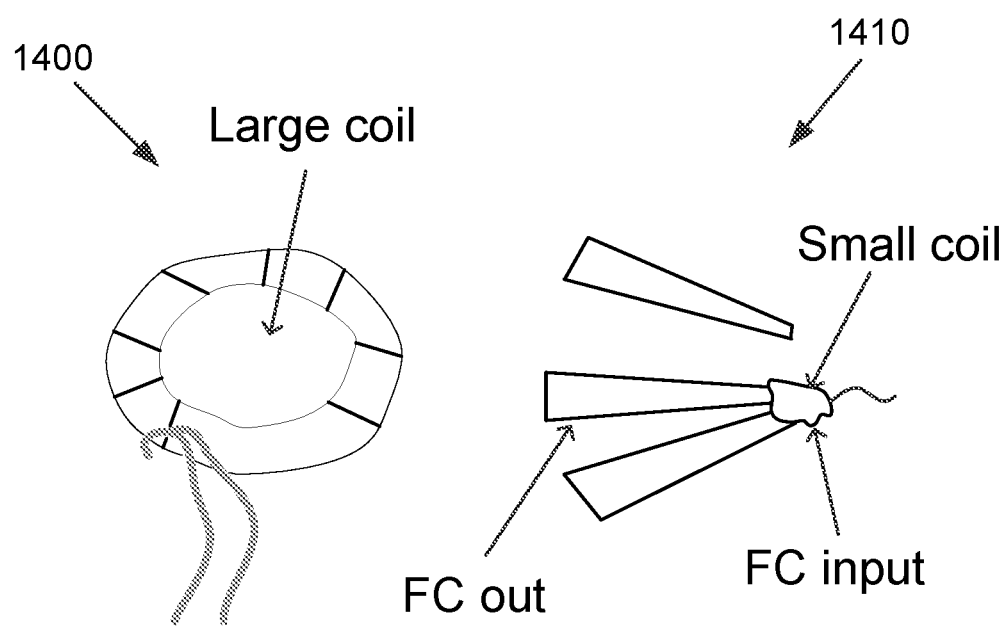
FIG. 14 illustrates a large and small coil for testing operation of a 4-channel FG, according to an embodiment of the present invention.

Correlations between FG channels and image reconstruction feasibility were also investigated. The response of a four-channel ferromagnetic FG to excitations with a small coil located near the "high-resolution" end was experimentally measured. See large coil 1400 and small coil 1410 of FIG. 14. The results were arranged into the transfer matrix below:

$$M = \begin{pmatrix} 260 & 125 & 40 & 20 \\ 270 & 450 & 100 & 50 \\ 60 & 133 & 317 & 124 \\ 50 & 82 & 320 & 320 \end{pmatrix}$$

where row and column indices are positions of the small and large coils, respectively. The coils are equally spaced from one another so that the positions thereof are defined by whole numbers. Matrix M has dominant diagonal elements and its inverse exists. It can be used to reconstruct the input image from four output measurements. However, near-diagonal elements are also significant, so some correlation exists between neighboring channels and some degradation of resolution is expected. Still, according to estimates, this will not prevent the detection of magnetic fields from single neurons.

Figure 15:
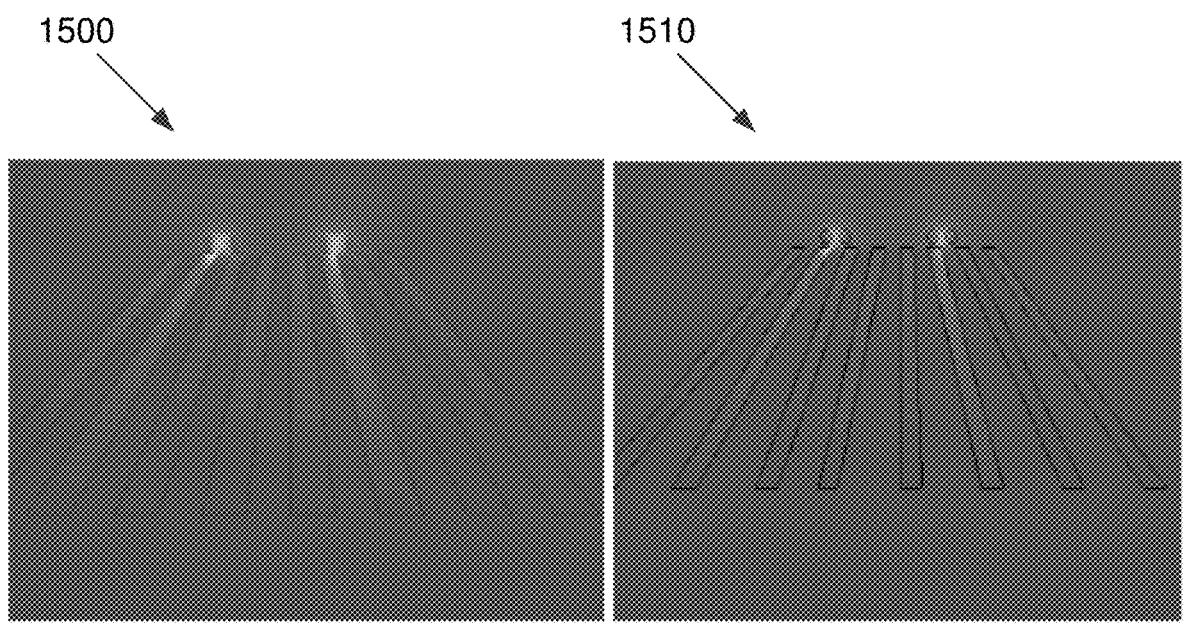
FIG. 15 illustrates intensity maps of the distribution of magnetic fields in FGs, according to an embodiment of the present invention.

Modeling based on the solution of quasi-static equations confirms the experimental result. Simulations were extended to 8 channels with variations in geometry, as shown in FIG. 15, to show that an FG with a large number of channels will work in a similar way and that the geometry of FIG. 14 can be modified to simplify the construction of the FG matrix from available ferrite components. More specifically, in FIG. 15, operation of multi-channel FG made of MnZn ferrite is shown. Two small coils simulate two neurons. Intensity maps 1500, 1510 show the distribution of magnetic field in FGs. Left map 1500 simulates expanding segments and right map 1510 simulates bars. The magnetic flux image reveals the analogy with light propagation in optical guides and provides an intuitive guide to understanding the FG operation. 1D and 2D arrays of FGs work quite similarly.

Figure 16:
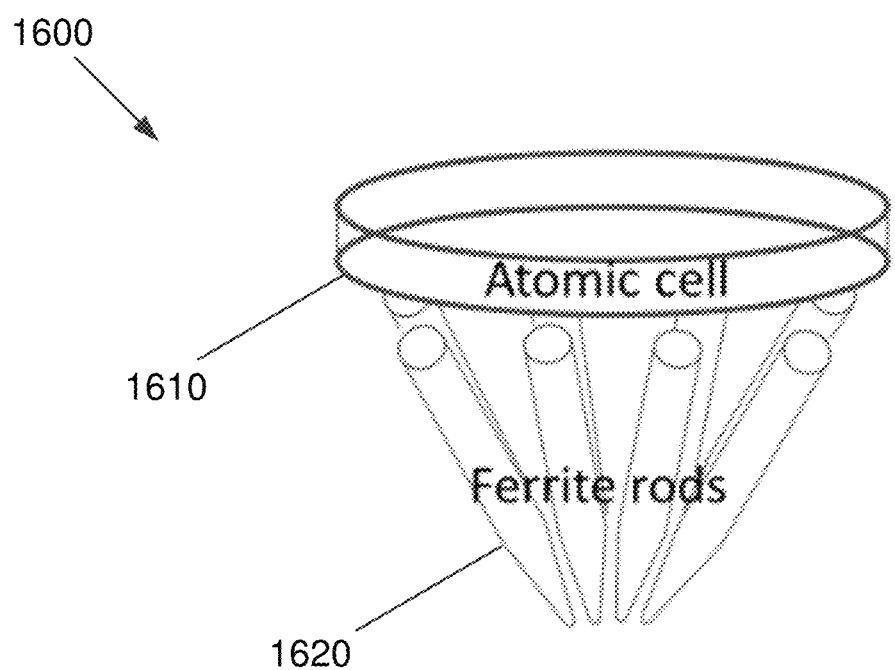
FIG. 16 is a perspective view illustrating an ultra-sensitivity magnetic microscope based on an FG+AM matrix, according to an embodiment of the present invention.

A 2D matrix of FGs for a magnetic microscope 1600 of FIG. 16 may be constructed by combining multiple 500-micron ferrite rods or bars 1620 sharpened to the required resolution and placing these in proximity to an atomic cell 1610.

Third, the question of FG noise was addressed because this may reduce sensitivity. To avoid large Johnson noise, the FG may be constructed from non-conductive MnZn ferrite. The noise in ferrite material is dominated by domain thermal motion, with Barkhouser noise negligible for weak measured fields (in sensitive measurements, less than 100 pT). Experimental measurements of ferrite shields show that MnZn ferrite produces noise at the fT level. It was estimated that the ferrite noise at 1 Hz frequency is expected to be ~1 fT at the FG output. Theory also predicts that this noise falls off as a square root with frequency, and lower noise is expected for the characteristic 1 kHz frequency of a single-neuron signal. Thus, it is possible to conclude that ferrite noise will not prevent single-neuron detection. Other applications require even less sensitivity.

Finally, it is important to understand whether there is any influence of the ferrite FG on AM performance. A FG can be used either to increase sensitivity by focusing external flux on an AM or to increase resolution, as performed by some embodiments. The effect of a FG on an AM in both cases will be similar. The FG did not affect the performance of the AM much, and thus this is expected in applications of some embodiments as well. A demagnetization procedure, usually done with coils, may help to minimize residual gradients and fields.

An optimized FG-OPM has sufficient resolution and sensitivity for the detection of a single or a small number of neurons or functional domains of 0:3-0:6 mm size, in which neurons show a coherent response. This is one of many possible applications of the FG-OPM to help understand the structure and function of the brain at different scales. The FG-OPM's advantage of a small stand-off distance is especially important in ex vivo applications in bioassay, where an FG-OPM can monitor nanoparticles (typically tagged to cells) in solution flowing less than 100 μm from the probe tips of the FG-OPM. Decreasing the stand-off distance produces enormous gain in sensitivity—the nanoparticles dipole field falls off as the cube of the distance—and it is estimated that an FG-OPM should detect a single magnetic nanoparticle as small as 30 nm after a few seconds of measurement time. Finally, FG-OPM resolution and sensitivity are expected to be sufficient for various non-destructive tests (NDTs), in which defects using either natural magnetic properties of materials or induced magnetic fields by applied currents, AC magnetic fields (eddy currents), and other methods can be revealed and studied. SQUIDs have been at the forefront of NDT applications due to their outstanding combination of sensitivity and resolution. However, an FG-OPM would successfully compete with SQUID technology, with the advantages of non-cryogenic operation and decreased stand-off distances.

An FG-OPM probe microscope has been constructed, and demonstrated to have the combined resolution of 250 μm and sensitivity of 23 pT$\sqrt{Hz}$, limited by the probe tip geometry. The numerical simulations show that optimized FGs can improve the resolution to 80 μm with a sensitivity to 8.1 pT$\sqrt{Hz}$ when using an OPM with 10 fT$\sqrt{Hz}$, now commercially available from QuSpin™.

3D Simulations for 16 Channel Array for Magnification of 2D Magnetic Images

While the flat-geometry modeling showed the possibility of magnification of a 1D image, it is also of considerable interest to be able to magnify 2D images to realize microscopy in the non-scanning mode or accelerate the 2D scan with parallel detection. A possible geometry for 2D magnification, which turned out to be quite optimal, is an array of conical ferromagnetic FGs that converge to a point, but cut off at some distance from the origin. Since it is rather tedious to simulate a large number of FGs, numerical simulations were limited to a 4×4 array for this example. This array may be used in the future experiments with a standard 16-channel 24-bit data acquisition (DAQ) system. Similar results are expected in the case of larger arrays, although the geometry should be optimized.

With specific potential applications in mind, such as detection of a single neuron, the bottom diameter of each FG cone was chosen to be 100 μm, which is a typical scale of a neuron, while the top diameter 1 mm was chosen to match the sensor size of a microfabricated OPM. Microfabricated OPMs can have fairly high sensitivity even at a 1 mm cell size, and they may be the best sensors to achieve optimal resolution and sensitivity in conjunction with FGs arrays for this application. The other dimensions (i.e., the center-to-center distance of adjacent FGs at the top and bottom of 2.5 mm and 0.25 mm, respectively, and the vertical length of FGs of 5 mm) were chosen from three criteria: (1) some distance between cones is necessary to reduce crosstalk that negatively affects image reconstruction; (2) significant elongation of peripheral cones should be avoided since it can lead to a reduction cone flux transfer and non-uniformity of the image transfer (the maximum solid angle is also limited by $2\pi$); and (3) the length of the cones should be as short as possible to improve the overall efficiency of the flux transfer.

To investigate the propagation of magnetic flux from a target small object through the FG array, three-dimensional numerical simulations were performed using the finite element analysis software COMSOL Multiphysics 4.3™. The relative permeability of the FGs was arbitrarily set at 100,000, but the result does not depend much on the permeability down to 5,000. A spherical 100 μm diameter source magnetized in the z direction, simulating a single neuron (geometrically; the strength is irrelevant the transfer function is of interest), was positioned at a 50 μm standoff distance from the bottom of the FG. This is marked with a dotted line in 3D numerical simulation 1700 of FIG. 17A. The target source was characterized by filling its volume with a uniform magnetization of $7.5 \times 10^5$ A/m. It should be noted that specific magnetization does not matter because it cancels out when flux transfer is calculated as the ratio of the output to input magnetic fields.

Figure 17A:
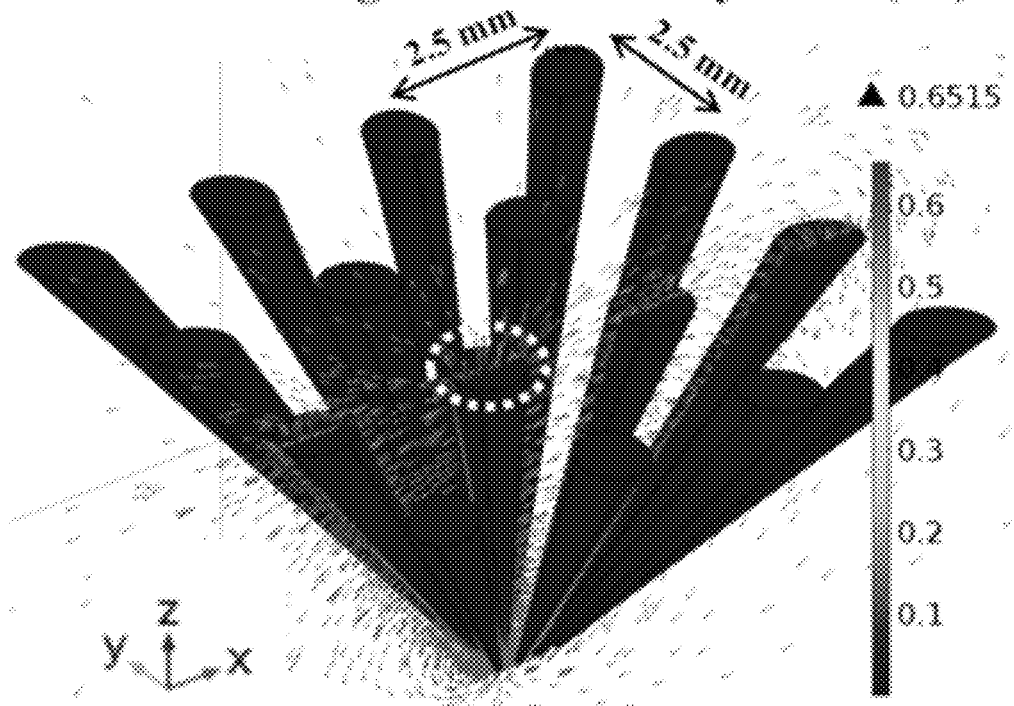
FIG. 17A is a 3D numerical simulation illustrating the magnetic field distribution in a FG array with field lines, according to an embodiment of the present invention.
Figure 17B:
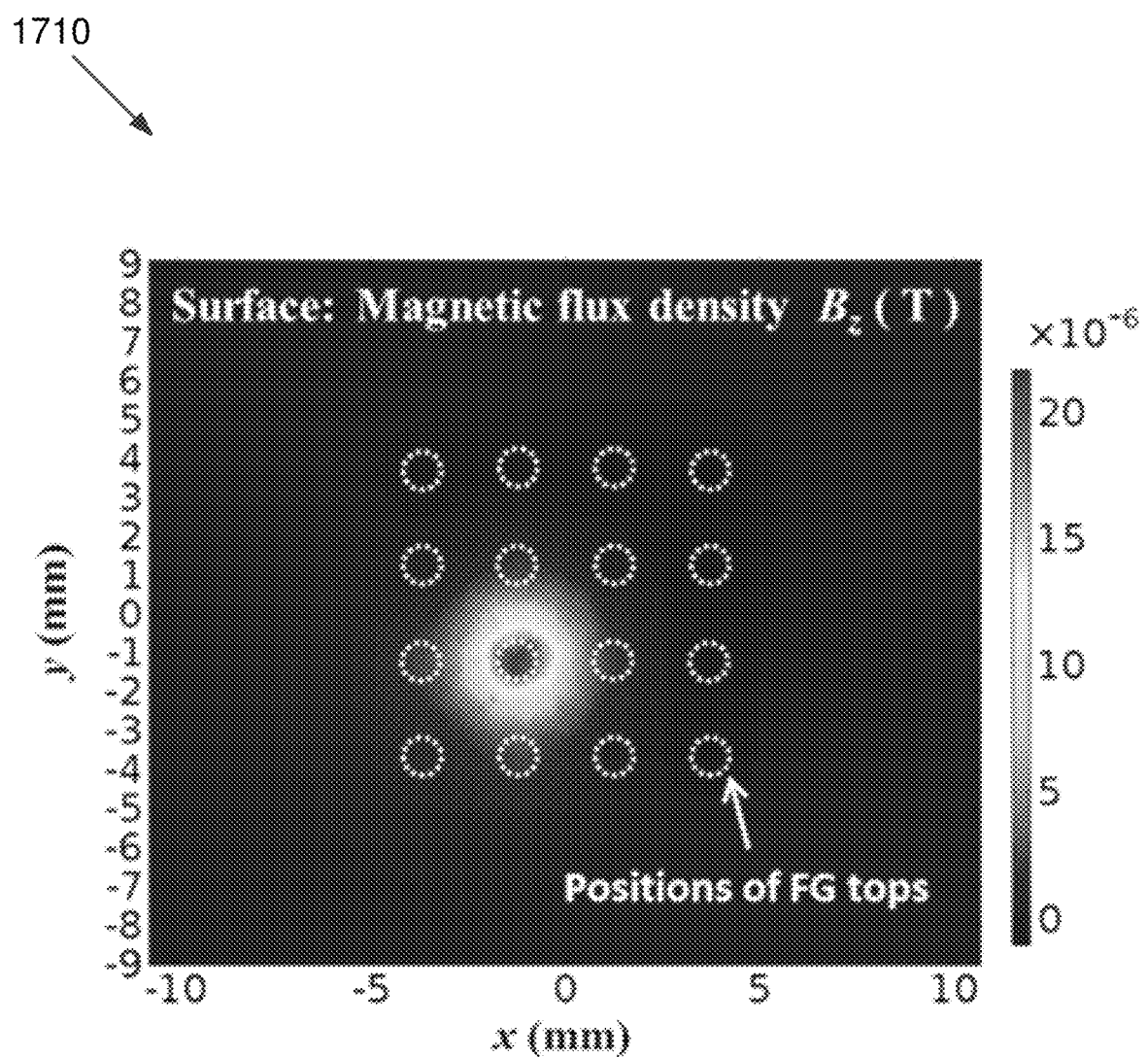
FIG. 17B is a 3D numerical simulation illustrating a two-dimensional projection of $B_z$ onto the xy plane at a 1 mm standoff distance from the top of the FGs, according to an embodiment of the present invention.

The results of simulations 1700, 1710 for a single source are shown in FIGS. 17A and 17B, respectively. More specifically, FIG. 17A shows the magnetic field distribution with field lines, which help to visualize magnetic flux leakage, predominant at the bottom areas. The analysis of leakage is important since it results in a reduction of the magnetic field measured by the magnetometer at the top areas. To provide more quantitative information on the field in the vicinity of the OPM, FIG. 17B indicates a 2D cross section of $B_z$ by the xy plane at a 1 mm stand-off distance from the top of the FGs. This distance was practically chosen by considering the thickness of the micro-fabricated Rb cell wall and the heat insulating vacuum chamber and heat-conducting cooling pad that separated the hot Rb cell heated to 200° C. from the ambient magnetic field source, such as a neuron. The z component is chosen as one possible direction of sensitivity of the vector atomic magnetometer operating in the SERF regime. The dotted lines mark the positions of the tops of the FG.

This simulation revealed that the FG array localizes the source well and the crosstalk between the FGs can be well neglected: $B_z$ of the adjacent FGs is ten times smaller. To determine the sensitivity of each channel of the FG-OPM magnetometer to the small-size magnetic source, the field transfer coefficient of the active FG was calculated, which is the ratio of $B_z$ at a 1 mm standoff distance from the top of the FG ($B_{out}$) to $B_z$ at the bottom of the FG ($B_{in}$=76 mT). The calculated transfer coefficient was $2.8 \times 10^{-4}$, which results in a FG-OPM sensitivity of 19 pT/Hz$^{1/2}$ with the assumption of the OPM sensitivity of 5 fT/Hz$^{1/2}$ by dividing the OPM sensitivity by the transfer coefficient. The resolution of 100 μm and sensitivity of 19 pT/Hz$^{1/2}$, which is is practically possible with the geometry that was modeled, will be sufficient to detect a single neuron with some averaging or a small number of neurons—the target application of the FG-OPM microscope in some embodiments.

Figure 18A:
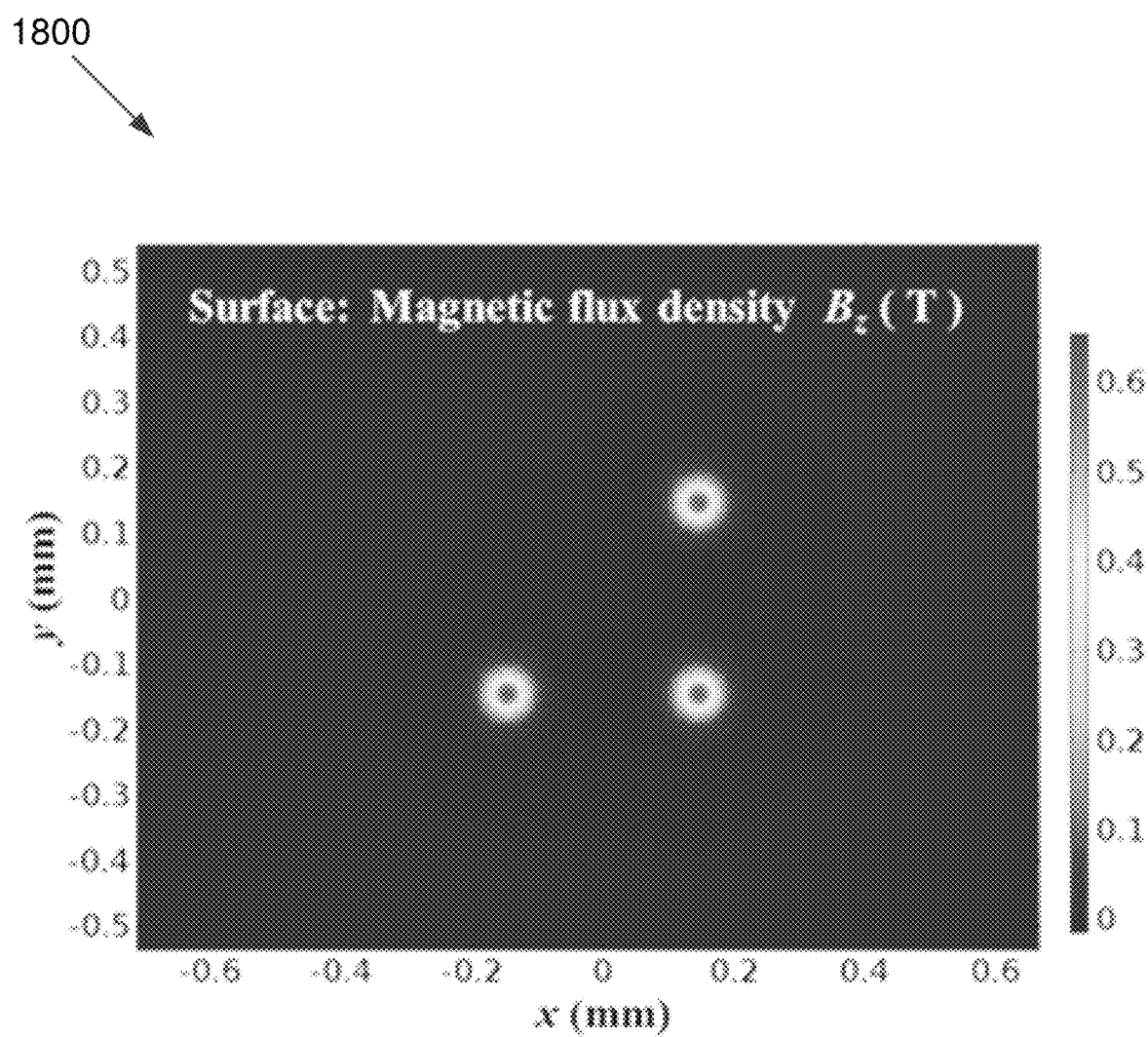
FIG. 18A is a 3D numerical simulation with three 100 μm diameter sphere sources located at a 50 μm stand-off distance from the bottom of FGs illustrating a 2D projection of $B_z$ onto the xy plane at a 50 μm standoff distance from the bottom of the FGs, according to an embodiment of the present invention.
Figure 18B:
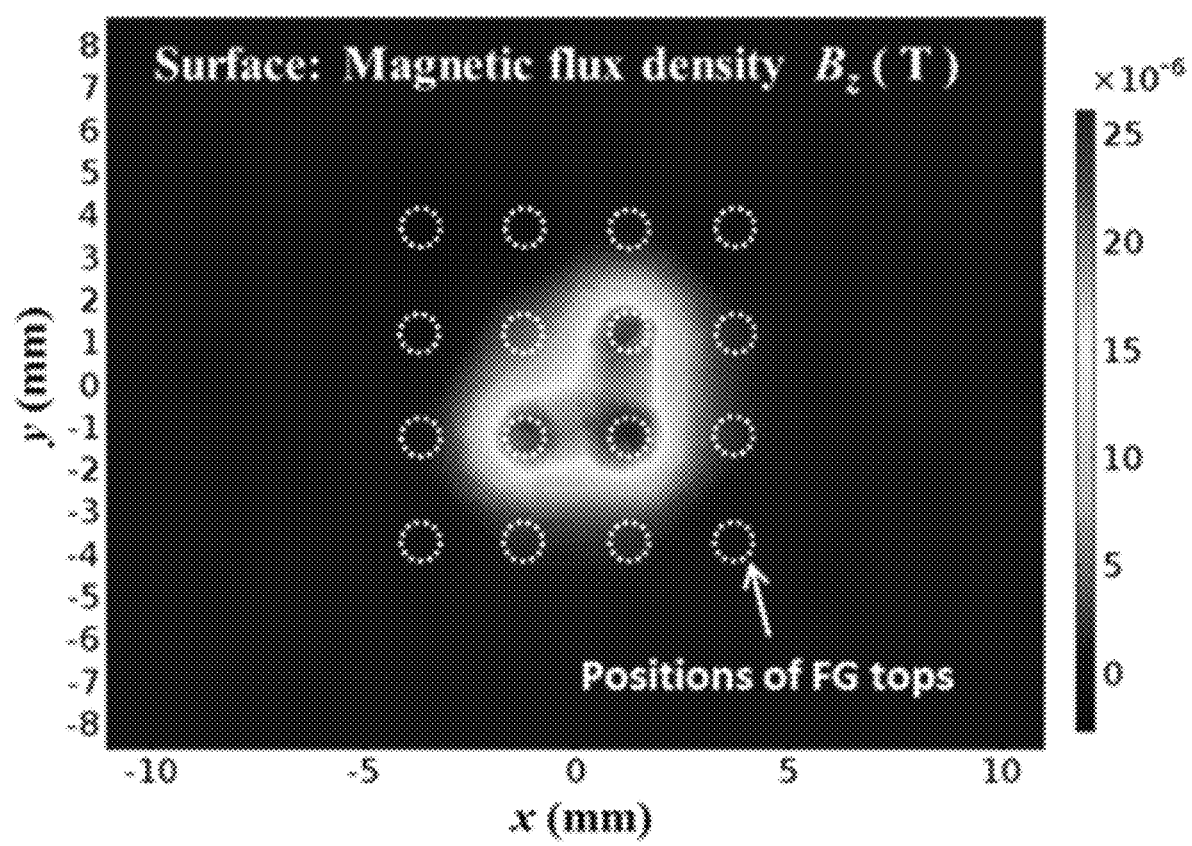
FIG. 18B is a 3D numerical simulation with three 100 μm diameter sphere sources located at a 50 μm standoff distance from the bottom of FGs illustrating a 2D projection of $B_z$ onto the xy plane at 1 mm standoff distance from the top of the FGs, according to an embodiment of the present invention.

The sensitivity can be further improved by reducing the vertical length of the FGs. It was observed that the field transfer coefficient increased exponentially at shorter length. In the case of a 1 mm length, the sensitivity would be enhanced by a factor of 2.4. These results hold for a lower relative permeability down to 5,000. One reason to consider this lower mu is that low-noise MnZn ferrite has such a relative permeability and can be used to reduce noise in the output of the FG array below that of the OPM. To further study the resolution and actual feasibility of imaging magnetic field distribution, a simulation with three 100 μm diameter magnetic sources located at a 50-μm standoff distance from the bottom of three FGs was also performed. 3D numerical simulations 1800, 1810 of FIGS. 18A and 18B show 2D projection of $B_z$ onto the xy plane at a 50 μm standoff distance from the bottom of the FGs and a 1 mm standoff distance from the top of the FGs, respectively. This simulation indicates that the field distribution from the sources can be efficiently magnified by the FG array (magnetic lens) at the vapor cell, significantly improving the resolution. It can also be concluded that the three sources can be accurately localized.

Noise and Other Potential Issues

The above simulations show the great potential for using an array of FGs to magnify the image of the magnetic distribution to match its pixels to the size of micro-fabricated OPMs, the most sensitive noncryogenic sensors. However, there are several factors that can negatively affect the performance of the FG-OPM device. First of all, the noise of the ferromagnetic material used to construct the array of FGs has an effect. The noise is particularly large in the case of highly conductive magnetic materials, such as mu-metal. Fortunately, poorly conductive ferrite with sufficiently high μ exists that also can be used for constructing FGs. The noise in ferrite material is dominated by domain thermal motion, with Barkhausen noise negligible in weak measured fields. Experimental measurements of ferrite shields showed that MnZn ferrite produces noise at the femtotesla level. It is estimated that the ferrite noise at a 1 Hz frequency is expected to be ~1 fT at the FG output. Theory also predicts that this noise falls off as a square root with frequency, and lower noise is expected for the characteristic 1 kHz frequency of a single-neuron signal. Thus, it may be concluded that if the array of FGs is made of MnZn ferrite, the noise will not prevent single-neuron detection. Other applications, such as the detection of signals from neuron domains, are less demanding.

Another issue is the negative effect of the FGs on the OPM performance. Recent measurements showed, however, that with proper compensation of gradients using gradient coils, the gradients generated by the FGs can be cancelled to a sufficient level such that the OPM sensitivity is not affected. The gradient compensation approach is also possible for FG arrays. In the case of FG arrays, the field of each FG can be compensated by using a coil wound on the cone. Thus, if each cone does not produce a significant field, the field at the position of the OPM will be also small. Alternatively, each cone can be demagnetized using an exponentially decaying AC field, similar to what is done when shields are demagnetized. It is also possible to heat the ferrite above the Curie temperature in the zero field. This is particularly easy to do with small arrays. In the near future, it is planned to construct an array of 4×4 FGs from ferrite or other magnetic materials and test demagnetization, as well as other properties.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
an atomic magnetometer (AM); and
an array of flux guides (FGs) configured to act as a magnetic lens that expands microscopic magnetic distribution to match dimensions of the AM, wherein
the AM is a centimeter-scale optically pumped magnetometer (OPM) and the FGs comprise manganese-zinc (MnZn) ferrite.

2. The apparatus of claim 1, further comprising:
at least one additional AM, forming an array of AMs that realizes multi-channel operation in conjunction with the AM, wherein
the array of AMs comprises single channel AMs.

3. The apparatus of claim 1, further comprising:
a retro-reflecting mirror, wherein
the AM comprises a pancake atomic cell that is arranged such that a probe beam passes through the pancake atomic cell twice via the retro-reflecting mirror.

4. The apparatus of claim 3, wherein an angle of the probe beam is less than 90°.

5. The apparatus of claim 1, wherein the AM comprises an array of photodetectors to realize multi-channel operation.

6. The apparatus of claim 1, wherein the AM is a spin-exchange relaxation-free (SERF) magnetometer.

7. The apparatus of claim 1, wherein the array of FGs forms a matrix of FGs constructed by combining multiple ferrite rods or bars that are sharpened to a requisite resolution.

8. The apparatus of claim 7, wherein the matrix of FGs is positioned proximate to an atomic cell.

9. The apparatus of claim 1, further comprising:
a rubidium (Rb) vapor cell located in a center of a gap between the FGs.

10. The apparatus of claim 9, further comprising:
a magnetic target placed sufficiently close to probe tips of the FGs such that magnetic flux from the target is transmitted towards the vapor cell through the FGs, and a y component of a magnetic field of the target can be measured.

11. An apparatus, comprising:
an atomic magnetometer (AM) including an atomic cell; and
a matrix of flux guides (FGs) proximate to the atomic cell constructed by combining multiple ferrite rods or bars that are sharpened to a requisite resolution.

12. The apparatus of claim 11, further comprising:
wherein the matrix of FGs is configured to act as a magnetic lens that expands microscopic magnetic distribution to match dimensions of the AM.

13. The apparatus of claim 12, wherein the AM is a centimeter-scale optically pumped magnetometer (OPM) and the matrix of FGs comprise manganese-zinc (MnZn) ferrite.

14. The apparatus of claim 12, wherein the AM comprises an array of photodetectors to realize multi-channel operation.

15. The apparatus of claim 1, wherein the AM is a spin-exchange relaxation-free (SERF) magnetometer.

16. A flux guide optically pumped magnetometer (FG-OPM) microscope, comprising:
a plurality of manganese-zinc (MnZn) ferrite FGs; and a centimeter-scale OPM comprising a rubidium (Rb) vapor cell located in a center of a gap between the MnZn ferrite FGs.

17. The FG-OPM of claim 16, further comprising:

a magnetic target placed sufficiently close to probe tips of the MnZn ferrite FGs such that magnetic flux from the target is transmitted towards the vapor cell through the MnZn ferrite FGs, and a y component of a magnetic field of the target can be measured.

18. The FG-OPM of claim 16, wherein the FG-OPM operates in the spin-exchange relaxation-free (SERF) regime, in which there is no direct current (DC) field across the vapor cell, and no flux is transmitted from the vapor cell to the target.

19. The FG-OPM of claim 16, wherein the OPM is configured to act as a magnetic lens that expands microscopic magnetic distribution to match dimensions of the OPM.

\* \* \* \* \*